United States Patent
Davidi et al.

(10) Patent No.: US 11,873,434 B2
(45) Date of Patent: Jan. 16, 2024

(54) METHOD FOR SYNTHESIZING A SEMICONDUCTING NANOSIZED MATERIAL

(71) Applicant: Merck Patent GmbH, Darmstadt (DE)

(72) Inventors: Inbal Davidi, Modiin (IL); Amir Holtzman, Rehovot (IL); Alex Irzh, Rehovot (IL); David Mocatta, Gadera (IL); Elizaveta Kossoy, Rehovot (IL); Sanaa Khalil, Jerusalem (IL); Denis Glozman, Modiin (IL)

(73) Assignee: MERCK PATENT GMBH, Darmstadt (DE)

( * ) Notice: Subject to any disclaimer, the term of this patent is extended or adjusted under 35 U.S.C. 154(b) by 99 days.

(21) Appl. No.: 17/608,296

(22) PCT Filed: Apr. 30, 2020

(86) PCT No.: PCT/EP2020/061985
§ 371 (c)(1),
(2) Date: Nov. 2, 2021

(87) PCT Pub. No.: WO2020/225072
PCT Pub. Date: Nov. 12, 2020

(65) Prior Publication Data
US 2022/0259495 A1  Aug. 18, 2022

(30) Foreign Application Priority Data
May 3, 2019  (EP) .................................. 19172508

(51) Int. Cl.
| | |
|---|---|
| *C09K 11/70* | (2006.01) |
| *C09K 11/08* | (2006.01) |
| *C09K 11/88* | (2006.01) |
| *C09K 11/74* | (2006.01) |
| *B82Y 20/00* | (2011.01) |
| *B82Y 40/00* | (2011.01) |

(52) U.S. Cl.
CPC ........ *C09K 11/703* (2013.01); *C09K 11/0883* (2013.01); *C09K 11/7492* (2013.01); *C09K 11/883* (2013.01); *B82Y 20/00* (2013.01); *B82Y 40/00* (2013.01)

(58) Field of Classification Search
CPC . C09K 11/703; C09K 11/0883; C09K 11/883; C09K 11/7492; B83Y 20/00; B83Y 40/00
See application file for complete search history.

(56) References Cited

U.S. PATENT DOCUMENTS

| | | | |
|---|---|---|---|
| 8,784,703 | B2 | 7/2014 | Kahen et al. |
| 9,153,731 | B2 | 10/2015 | Kahen |
| 10,858,584 | B2 | 12/2020 | Houtepen et al. |
| 2018/0047878 | A1 | 2/2018 | Glarvey et al. |
| 2020/0102494 | A1 | 4/2020 | Mocatta et al. |

FOREIGN PATENT DOCUMENTS

| | | | |
|---|---|---|---|
| CN | 106479482 | * | 3/2017 |
| CN | 107338048 | A | 11/2017 |
| WO | 17074897 | A1 | 5/2017 |
| WO | 18215396 | A1 | 11/2018 |

OTHER PUBLICATIONS

International Search Report PCT/EP2020/061985 dated Jul. 21, 2020 (pp. 1-3).
Yang et al., "Full Visible Range Covering InP/ZnS Nanocrystals with High Photometric Performance and Their Application to White Quantum Dot Light-Emitting Diodes" Adv. Mater., 2012, 24, 4180 https://doi.org/10.1002/adma.201104990.
Ramasamy et al., "Tunable, Bright, and Narrow-Band Luminescence from Colloidal Indium Phosphide Quantum Dots" Chem Mater, 2017, 29, 6893.
Pietra et al., "Tuning the Lattice Parameter of InxZnyP for Highly Luminescent Lattice-Matched Core/Shell Quantum Dots" ACS Nano, 2016, 10 (4), pp. 4754-4762.
Gary et al: "Two-Step Nucleation and Growth of InP Quantum Dots via Magic-Sized Cluster Intermediates", Chemistry of Materials, vol. 27, No. 4, Feb. 10, 2015 (Feb. 10, 2015), pp. 1432-1441, XP055462428, ISSN: 0897-4756, DOI: 10.1021/acs.chemmater.5b00286.
Huang et al., "Recent progress in photocathodes for hydrogen evolution" J. Mater. Chem. A, 2015, 3, 15824-15837.
Pietra et al., "Ga for Zn Cation Exchange Allows for Highly Luminescent and Photostable InZnP-Based Quantum Dots" Chem. Mater. 2017, 29, 5192-5199.
Kim et al., "Highly Luminescent InP/GaP/ZnS Nanocrystals and Their Application to White Light-Emitting Diodes" JACS 2012, 134, 3804-3809.
Park et al. "Highly luminescent InP/GaP/ZnS QDs emitting in the entire color range via a heating up" Scientific Reports 2016, 6, 30094.
Hens et al., "Light absorption by colloidal semiconductor quantum dots" J. Mater. Chem., 2012, 22, 10406 https://doi.org/10.1039/C2JM30760J.
Achtstein et al.,"Linear absorption in CdSe nanoplates: Thickness and lateral size dependency of the intrinsic absorption" J. Phys. Chem. C, 2015, 119, 20156.
Angeloni et al., "Disentangling the Role of Shape, Ligands, and Dielectric Constants in the Absorption Properties of Colloidal CdSe/CdS Nanocrystals" ACS Photonics, 2016, 3, 58.

* cited by examiner

*Primary Examiner* — C Melissa Koslow
(74) *Attorney, Agent, or Firm* — Millen, White, Zelano & Branigan, P.C.; Csaba Henter

(57) ABSTRACT

The present invention relates to a method for synthesizing a semiconducting nanosized material.

27 Claims, No Drawings

METHOD FOR SYNTHESIZING A SEMICONDUCTING NANOSIZED MATERIAL

FIELD OF THE INVENTION

The present invention relates to a method for synthesizing a semiconducting nanosized material comprising at least two components, a semiconducting nanosized material obtainable by the method, optical medium and an optical device.

BACKGROUND ART

Quantum dots have large potential for use in display technologies due to their high quantum yields and narrow emission line-widths, which allow a large colour gamut to be attained. Cadmium based quantum dots have traditionally given the highest quantum yields and the lowest emission line-widths. However, recent health and safety regulations have limited the use of cadmium and so cadmium free alternatives are preferred.

Unfortunately, the leading cadmium free alternative, InP, shows significantly larger line widths than cadmium based materials. Spectroscopic evidence of single InP quantum dot line widths show that they are comparable to cadmium based materials. This fact suggests that the cause of the large line-widths exhibited by InP based quantum dots ensembles is the inhomogeneous broadening stemming from the large size distribution of the InP quantum dots. The inhomogeneous broadening in InP has two contributing factors one is the use of the highly reactive tris(trimethylsilyl)phosphine (PTMS) as the phosphorous precursor in most syntheses. The reactivity of the PTMS makes it hard to separate the nucleation and growth stages which is necessary to produce quantum dots with narrow size distributions like those achieved with cadmium based materials.

In the field of semiconductors for displays, several Parameters are of great importance: QY, FWHM, self-absorption and the amount of light absorbed per mg of material (OD/mg) at λ=450 nm where the blue LED in displays emits. Most of the research done on InP based NPs was with zinc chalcogenide Shell (ZnSe, ZnS or ZnSeS alloy) due to the high QY (type 1 materials), relative low FWHM and the absorption of the ZnE Shell.

Due to this most syntheses of InP core/shell dots give an FWHM for the final photoluminescence peak of >40 nm. One paper by X. Yang et al. gives an FWHM of 38 nm[1]. In these syntheses the FWHM of the final core/shell is largely determined by the size distribution of the InP cores and this ultimately limits the FWHM breadth.

Similarly, a document published by P. Ramasamy et al. discloses core/shell quantum dots having an InZnP core[2].

On top of this the quantum yield of the final InP/ZnS or InP/ZnSe quantum dots is partially determined by the lattice mismatch between the InP core and the ZnS or ZnSe shell. This mismatch can be tuned by controlling the amount of zinc in the InP core[3].

Recently a method for synthesizing InP quantum dots was reported[4,5]. This method uses InP magic sized clusters (MSCs) as single source precursors (SSP) instead of the PTMS and indium-carboxylate.

Using InGaP alloy (band gap=1.8-1.9 eV) as the shell of InP cores (band gap=1.34 eV) or synthesizing InZnGaP cores and GaP as shell (band gap=2.26 eV) also produces type I kind of NPs (FIG. 1)[6,7].

Using GaP as buffer layer between InP based cores and ZnS/ZnSe/ZnSeS shell produces Quantum Dots (QD) with high Quantum Yield (QY). Other documents use InZnP cores for the Ga treatment to cause the red-shift they add a layer of GaP which causes FWHM widening.[8-14]

Furthermore, some documents describe that the shape of the QD may have an influence of the optical density per mg (OD/mg) of the QD.[15-17]

REFERENCE DOCUMENTS

1. X. Yang et al., *Adv. Mater.*, 2012, 24, 4180
2. Ramasamy et al., *Chem Mater*, 2017, 29, 6893
3. F. Pietra et al., *ACS Nano*, 2016, 10 (4), pp 4754-4762)
4. D. Gary et al., *Chem. Mater.*, 2015, 1432
5. WO 2018/215396 A1
6. Qiang Huang et al., *J. Mater. Chem. A*, 2015, 3, 15824-15837
7. US 2018/0047878 A1
8. F. Pietra et al., Chem. Mater. 2017, 29, 5192-5199 DOI: 10.1021/acs.chemmater.7b00848
9. WO 2017/074897 A1
10. Sungwoo Kim et al., *JACS* 2012, 134, 3804-3809
11. U.S. Pat. No. 8,784,703 B2
12. CN 107338048 A
13. U.S. Pat. No. 9,153,731 B2
14. Park et al. *Scientific Reports* 2016, 6, 30094, DOI: 10.1038/srep30094
15. Z. Hens and I. Moreels, *J. Mater. Chem.*, 2012, 22, 10406
16. A. Achtstein et al., *J. Phys. Chem. C*, 2015, 119, 20156, DOI: 10.1021/acs.jpcc.5b06208
17. I. Angeloni et al., *ACS Photonics*, 2016, 3, 58, DOI: 10.1021/acsphotonics.5b00626

Quantum dots obtainable according to prior art documents could be used. However, it is a permanent desire to improve the features of these quantum dots.

Therefore, it is an object of embodiments of the present invention to provide quantum dots having a high quantum yield, a high absorption, improved color purity and efficiency, preferably an improved energy efficiency. It is an additional object of the present invention to provide quantum dots which can be applied in low amounts for achieving a desired property of the apparatus comprising the present quantum dots. It is a further object of embodiments of the present invention to provide quantum dots having a high optical density. A further object of embodiments of the present invention is providing quantum dots having an improved thermal stability in polymeric matrixes and lifetime.

A specific object of the present invention is providing quantum dots having emission and/or absorption in the red part of the spectrum. Unfortunately, when growing InZnP cores the addition of the zinc causes results in an exciton peak around <570 nm. To reach the required CWL these particles need to be grown to larger sizes. During this growth stage the FWHM increases. Therefore, red quantum dots being achieved by conventional methods have an increased FWHM.

It is an object of embodiments of the present invention to provide an efficient and/or cheap method for production of improved quantum dots.

The above objective is accomplished by quantum dots and a method for producing the same according to the present invention.

SUMMARY OF THE INVENTION

Surprisingly, the inventors have found that a method for synthesizing a semiconducting nanosized material comprising at least two components with all the features of present solves one or more of the problems mentioned above. The semiconducting nanosized material comprising at least two components surprisingly can be used to achieve quantum dots having a low FWHM, high optical density, high quantum yields and further desirable features as mentioned above.

Consequently, the present invention provides a method for synthesizing a semiconducting nanosized material comprising at least two components, wherein the method comprises the steps of a) providing an III-V semiconducting nanosized material;

b) heating the provided III-V semiconducting nanosized material to a temperature above 250° C.;

c) adding III-V semiconducting nanosized material in at least one additional step to the heated III-V semiconducting nanosized material of step b);

d) reacting the added III-V semiconducting nanosized material with the heated III-V semi-conducting nanosized material of step b) in order to achieve a semiconducting nanosized material comprising at least two components.

Preferably said method of the present invention solves all the problems mentioned above at the same time.

In another aspect, the present invention also relates to a semiconducting nanosized material, preferably a semiconducting light emitting nanosized material, more preferably quantum dots (QD) being obtainable by a method for synthesizing a semiconducting nanosized material comprising at least two components and/or a semiconducting nanosized material comprising at least three components.

In another aspect, the present invention further relates to composition comprising the semiconducting nanosized material comprising at least two components and/or the semiconducting nanosized material comprising at least three components, and at least one additional material, preferably the additional material is selected from the group consisting of organic light emitting materials, inorganic light emitting materials, charge transporting materials, scattering particles, host materials, nanosized plasmonic particles, photo initiators, and matrix materials.

In another aspect, the present invention further relates to formulation composition comprising or consisting of the semiconducting nanosized material comprising at least two components and/or the semiconducting nanosized material comprising at least three components, and at least one solvent.

In another aspect, the present invention also relates to use of the semiconducting nanosized material comprising at least two components and/or the semiconducting nanosized material comprising at least three components, or the composition, or the formulation, in an electronic device, optical device or in a biomedical device.

In another aspect, the present invention relates to an optical medium comprising a semiconducting nanosized material comprising at least two components and/or a semiconducting nanosized material comprising at least three components.

In another aspect, the present invention also relates to an optical device comprising the optical medium.

DETAILED DESCRIPTION OF THE INVENTION

The present invention provides a method for synthesizing a semiconducting nanosized material comprising at least two components, wherein the method comprises the steps of a) providing a III-V semiconducting nanosized material;

b) heating the provided III-V semiconducting nanosized material to a temperature above 250° C.;

c) adding III-V semiconducting nanosized material in at least one additional step to the heated III-V semiconducting nanosized material of step b);

d) reacting the added III-V semiconducting nanosized material with the heated III-V semi-conducting nanosized material of step b) in order to achieve a semiconducting nanosized material comprising at least two components.

Preferably, the method can include further steps, e.g. modifying the semiconducting nanosized material by a reaction with a second precursor and/or third cation precursor; and for providing a shell preferably comprising ZnS, ZnSe and/or ZnSeS as disclosed below in more detail.

In a preferred embodiment, the III-V semiconducting nanosized material provided in step a) is essentially identical to the III-V semiconducting nanosized material added in step c).

In a specific embodiment, III-V semiconducting nanosized material is selected from the group consisting of InP, InAs, InSb, GaP, GaAs, and GaSb or a mixture thereof, preferably InP.

Preferably, the III-V semiconducting nanosized material is a III-V cluster selected from the group consisting of InP, InAs, InSb, GaP, GaAs, and GaSb clusters, more preferably InP cluster.

Preferably, the III-V semiconducting nanosized material is a cluster material, more preferably a magical size cluster (MSC) comprising size of 4.0 nm or below, more preferably of 2.0 nm or below, even more preferably of 1.5 nm or below. The size is measured according to the method mentioned above and below (High Resolution Transmission Electron Microscopy; HRTEM) and is based on the arithmetic mean (number average).

More preferably, the III-V semiconducting nanosized material is a III-V magic sized cluster (MSC) selected from the group consisting of InP, InAs, InSb, GaP, GaAs, and GaSb magic sized clusters (MSC), preferably InP magic sized cluster (InP MSC), more preferably, it is $In_{37}P_{20}(O_2CR^1)_{51}$, wherein said $O_2CR^1$ of said $In_{37}P_{20}(O_2CR^1)_{51}$ is —$O_2CCH_2$Phenyl, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate, myristate, laurate, palmitate, stearate, or oleate.

It can be provided that the III-V semiconducting nanosized material is a cluster material, preferably a III-V magic sized cluster (MSC) being based on a nanocrystal core. Preferably, the III-V semiconducting nanosized material is based on a nanocrystal core, which consists solely of fused 6-membered rings with all phosphorus atoms coordinated to four indium atoms in a pseudo-tetrahedral arrangement. The nanocrystal core preferably have the formula $[In_{21}P_{20}]^{3+}$, $[In_{42}P_{40}]^{6+}$, $[In_{63}P_{60}]^{9+}$, $[In_{84}P_{80}]^{12+}$, $[In_{95}P_{90}]^{15+}$, $[In_{31}P_{30}]^{3+}$, $[In_{41}P_{40}]^{3+}$, $[In_{51}P_{50}]^{3+}$, $[In_{61}P_{60}]^{3+}$, $[In_{71}P_{70}]^{3+}$, $[In_{81}P_{80}]^{3+}$, $[In_{91}P_{90}]^{3+}$. In this preferred embodiment the subset of atoms preferably possesses a C2 rotation axis that bisects two phosphorus atoms and a single indium atom located at the center of the particle, and measures approximately 1.3 nm×1.0 nm×1.0 nm. A dihedral angle of 160±3° is consistent along the longest straight In—P. The average In—P bond length in the $[In_{21}P_{20}]^{3+}$ core is 2.528 Å (min 2.479 Å, max 2.624 Å), and the average P—In—P bond angle is 109.2° (min 97.7°, max 119.9°). Preferably, an additional 16 indium atoms are singly bound to this core through surface-exposed phosphorus atoms, with an average bond length of 2.482 Å (min 2.450 Å, max 2.515 Å). Preferably, the sum of the single-bond covalent radii for In and P is 2.53 Å and it is preferably inferred that the bonding in the inorganic core of this cluster may be best viewed as covalent in nature, with differences in bond lengths between In—P in the core and In—P at the surface arising from internal strain. The structure is preferably assessed using single-crystal X-ray diffraction at 25° C. as well known in the art. (see J. Am. Chem. Soc. 2016, 138, 1510-1513). It should be noted that the core of the present QD may comprise additional InP or areas having another structure. Preferably, the area comprising the preferred structure as mentioned above is at least 30% by volume, more preferably at least 50% by volume and even more preferably at least 70% by volume.

Preferably, the III-V semiconducting nanosized material, preferably semiconducting nanosized cluster, more preferably the III-V magic sized cluster (MSC), comprises an Indium based carboxylate ligand, preferably $In(O_2CR^1)_3$, wherein said $O_2CR^1$ of said $In(O_2CR^1)_3$ is —$O_2CCH_2$Phenyl, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate, myristate, laurate, palmitate, stearate, or oleate.

In a preferred embodiment, the semiconducting nanosized material comprising at least two components are prepared by the use of clusters comprising indium phosphide, preferably magic sized clusters comprising indium phosphide, more preferably the semiconducting nanosized material comprising at least three components are prepared by the use of magic sized clusters essentially consisting of indium phosphide (InP MSC). Magic sized clusters (MSC) are well known in the art. MSC have a well-defined composition and exhibit remarkable thermodynamic stability relative to similar sizes.

Preferably, the cluster material, more preferably the magical size cluster (MSC) comprises size of 2.0 nm or below, preferably of 1.5 nm or below.

The size is measured according to the method mentioned above and below (High Resolution Transmission Electron Microscopy; HRTEM) and is based on the arithmetic mean (number average).

Preferably, the preparation of the magical size cluster (MSC) is achieved at a temperature of 80° C. or above, preferably 100° C. or above, more preferably 105° C. or above, even more preferably 110° C. or above.

Preferably, the preparation of the magical size cluster (MSC) is achieved at a temperature in the range of 80 to 200° C. more preferably in the range of 105 to 180° C., more preferably 110 to 140° C. In a further embodiment the preparation of the magical size cluster (MSC) is preferably achieved at a temperature in the range of 80 to 145° C., preferably 105 to 140° C., more preferably 105 to 120° C.

Preferably, the preparation of the III-V semiconducting nanosized material, preferably a magical size cluster (MSC) is achieved in the presence of a carboxylate compound, more preferably carboxylate compound having 2 to 30 carbon atoms, preferably 4 to 26 carbon atoms, even more preferably 8 to 22 carbon atoms, most preferably 10 to 18 carbon atoms.

Preferably, carboxylate compound comprises a linear, branched, saturated or unsaturated hydrocarbon residue having 1 to 29 carbon atoms, preferably 3 to 25 carbon atoms, even more preferably 7 to 21 carbon atoms, most preferably 9 to 17 carbon atoms being attached to the carboxyl group. More preferably, the carboxylate compound is a saturated carboxylate compound. The carboxylate compound could be added to the reaction mixture as a free acid or as a salt. Preferably, the carboxylate compound is added as a precursor, preferably an indium precursor wherein preferred indium precursors are disclosed above and below.

The InP magic size cluster (MSC) being useful as starting material for the preparation of semiconducting nanosized material comprising at least two components, preferably quantum dots can be prepared by any method known in the art. Preferably, the preparation of the InP MSC is achieved by a reaction mixture comprising a phosphorus precursor as mentioned above.

In addition to a phosphorus precursor, the preparation of the InP MSC is preferably achieved by a reaction mixture comprising an indium precursor as mentioned above.

In a specific embodiment, the preparation of the InP MSC being useful for preparation of the semiconducting nanosized material comprising at least three components is preferably achieved by a reaction mixture comprising a phosphorus precursor and an indium precursor being different to the phosphorus precursor and the molar ratio of the phosphorus precursor to the indium precursor is preferably in the range of 1:3 to 1:1, preferably 1:2.5 to 1:1, even more preferably 1:2 to 1:1.

Preferably, the InP MSC being useful as starting material for the preparation of the semiconducting nanosized material comprising at least three components exhibits an Exciton Peak of at least 370 nm, preferably at least 380 nm, in the absorbance spectrum measured at 25° using a toluene solution.

These data concern the InP MSC being achieved by the methods mentioned above and below and being preferably used as a starting material for the preparation of QD having the features mentioned above and below and preferably comprising at least three components and/or a shell. Preferably, the QD having a shell exhibits an Exciton Peak of between 610-800 nm, preferably between 610-670 nm, in the absorption spectrum measured at 25° using a toluene solution.

The III-V semiconducting nanosized material provided in step a) is heated to a temperature of at least 250° C. (250° C. or above), preferably of at least 280° C., more preferably of at least 300° C., even more preferably of at least 340° C. Preferably, the provided III-V semiconducting nanosized material is heated in step b) to a temperature in the range from 250° C. to 500° C., preferably in the range from 280° C. to 450° C., more preferably it is from 300° C. to 400° C.

It can be provided that the provided III-V semiconducting nanosized material is heated in step b) to a temperature in the range from 250° C. to 500° C., preferably in the range from 280° C. to 450° C., more preferably it is from 300° C. to 400° C.

In step c), III-V semiconducting nanosized material in at least one additional step is added to the heated III-V semiconducting nanosized material of step b). That is, in a least one further step, III-V semiconducting nanosized material is added to the heated composition of step b). The III-V semiconducting nanosized material added to the reaction composition of step b) is described in more detail above. The III-V semiconducting nanosized material added to the reaction composition of step b) can be the same as provided in step a) or different. Preferably the III-V semiconducting nanosized material added in step c) is essentially identical to the III-V semiconducting nanosized material provided in step a). The expression "essentially identical" means that the III-V semiconducting nanosized material comprises the same components such as InP, InAs, InSb, GaP, GaAs, and GaSb. Preferably, the III-V semiconducting nanosized material added in step c) and the III-V semiconducting nanosized material provided in step a) comprises InP, more preferably essentially consisting of InP MSC as mentioned above and below.

It can be provided that the added III-V semiconducting nanosized material is reacted with the heated III-V semiconducting nanosized material of step b) at a temperature of at least 250° C. (250° C. or above), preferably of at least 280° C., more preferably of at least 300° C., even more preferably of at least 330° C. Preferably, the added III-V semiconducting nanosized material is reacted with the heated III-V semiconducting nanosized material of step b) at a temperature in the range from 250° C. to 500° C., preferably in the range from 280° C. to 450° C., more preferably it is from 300° C. to 400° C. The reaction temperature may vary based on the fact that in a preferred embodiment, the added III-V semiconducting nanosized material has a lower temperature than the heated III-V semiconducting nanosized material of step b). As mentioned in the examples, the composition of the III-V semiconducting nanosized material added in step c) may have room temperature (range of 15° C. to 25° C.) when added to the heated composition of step b). However, the amounts of compositions should avoid a considerable cooling and the reactor should preferably control the reaction temperature within the ranges provided.

It can be provided that the steps c) and d) are performed in multiple times, preferably steps c) and d) are performed at least 3, more preferably at least 5 times. That is, the steps c) and d) are repeated appropriately. Preferably, the weight ratio of the III-V semiconducting nanosized material provided in step a) to the III-V semiconducting nanosized material provided in step c) is in the range of 10:1 to 1:10, preferably in the range of 5:1 to 1:5, more preferably in the range of 2:1 to 1:2, even more preferably in the range of 3:2 to 2:3.

In an embodiment, the reaction steps a) to d) are performed as a batch. In a specific embodiment, the III-V semiconducting nanosized material is preferably injected to a composition comprising the III-V semiconducting nanosized material provided in step a) and heated in step b). The injection can be performed several times as mentioned above and below.

The injections are preferably adjusted in order to keep the temperature in the ranges mentioned above and below in order to achieve a growing of the particles. The growing step is preferably achieved in a reaction time from 2 second to 3 hours, preferably from 5 seconds to 2.5 hours, more preferably from 20 seconds to 180 minutes, even more preferably from 30 seconds to 120 minutes, further more preferably from 45 seconds to 90 minutes, the most preferably from 60 seconds to 60 minutes in total. The injections may be done e.g. every 1 seconds to 120 seconds, preferably every 2 seconds to 60 seconds, more preferably every 3 seconds to 30 seconds.

In a further embodiment, the reaction steps a) and b) are performed in a continuous flow reaction. Preferably, the reaction steps c) and d) are performed in a continuous flow reaction. More preferably, the reaction steps a) to d) are performed in a continuous flow reaction Preferably, the reaction mixture comprises at least 0.1% by weight of the III-V semiconducting nanosized material, more preferably at least 0.25% by weight, even more preferably at least 0.5% by weight, even more preferably at least 1.0% by weight. Preferably, the reaction mixture comprises at most 20% by weight of the III-V semiconducting nanosized material, more preferably at most 10% by weight, even more preferably at most 5% by weight.

Preferably, the reaction mixture comprises the III-V semiconducting nanosized material in a range of from 0.1 to 20% by weight, more preferably from 0.25 to 15% by weight, even more preferably from 0.5 to 10% by weight, most preferably from 0.5 to 5% by weight, based on the total weight of the mixture.

Preferably, the III-V semiconducting nanosized material, preferably semiconducting nanosized cluster comprises a ligand.

Preferably, the ligand of the III-V semiconducting nanosized material, preferably semiconducting nanosized cluster is selected from one or more members of the group consisting of carboxylic acids, metal carboxylate ligands, phosphines, phosphonic acids, metal-phosphonates, amines, quaternary ammonium carboxylate salts, metal phosphonates and metal halides, preferably carboxylic acids such as oleic acid, acetic acid, stearic acid, myristic acid, lauric acid, carboxylates such as metal stearate, metal oleate, metal myristate, metal laurate, metal phenylate, metal acetate, more preferably indium myristate, or indium acetate; preferably phosphines and phosphine oxides such as Trioctylphosphine oxide (TOPO), Trioctylphosphine (TOP), and Tributylphosphine (TBP); phosphonic acids such as Dodecylphosphonic acid (DDPA), Tetradecylphosphonic acid (TDPA), Octadecylphosphonic acid (ODPA), and Hexylphosphonic acid (HPA); amines such as Oleylamine, Dodecyl amine (DDA), Tetradecyl amine (TDA), Hexadecyl amine (HDA), and Octadecyl amine (ODA), Oleylamine (OLA), alkenes, such as 1-Octadecene (ODE), thiols such as hexadecane thiol and hexane thiol; mercapto carboxylic acids such as mercapto propionic acid and mercaptoundecanoic acid; and a combination of any of these.

According to a preferred embodiment, the nanosized material of the first step and/or the III-V semiconducting nanosized material is used as a single source precursor. Preferably magic sized clusters essentially consisting of indium phosphide (InP MSC) or a III-V semiconducting nanosized material is degraded and/or solved by appropriate reaction temperatures in order to provide a source for achieving particles having an appropriate size. Preferably, the III-V semiconducting nanosized material is used as a single source precursor, the degraded single source precursor forms nucleation particles. In an additional step the nucleation particles are enlarged by a growing step. Preferably, this could be achieved by temperature profile and/or concentration profile, preferably as mentioned above and below and in the Examples.

The preparation of the semiconducting nanosized material comprising at least two components and/or magical size cluster preferably achieved using a solvent. The solvent is not specifically restricted. Preferably, the solvent is selected from the compounds mentioned above. Preferably a non-coordinating solvent is used.

Preferably, an alkane, more preferably a squalane is used as a solvent for the preparation of the semiconducting nanosized material comprising at least two components and/or the preparation of an magical size cluster. Preferably, an alkane having 6 to 46 carbon atoms, more preferably 8 to 40 carbon atoms, even more preferably 12 to 34 carbon atoms, most preferably 16 to 30 carbon atoms is used as a solvent. More preferably, the alkane being used as a solvent is a decane, dodecane, tetradecane, hexadecane, octadecane, eicosane. docosane, tetracosane, hexamethyltetracosane. The alkane may be linear or branched with branched alkanes such as squalane being preferred.

In an embodiment of the present invention, the preparation of the semiconducting nanosized material comprising at least two components and/or the preparation of an magical size cluster is preferably achieved by a reaction mixture comprising a solvent and the solvent comprises at least one alkene, preferably an alkene having 6 to 36 carbon atoms, more preferably 8 to 30 carbon atoms, even more preferably 12 to 24 carbon atoms, most preferably 16 to 20 carbon atoms. More preferably, the alkene is a 1-alkene, such as 1-decene, 1-dodecene, 1-Tetradecene, 1-hexadecene, 1-octadecene, 1-eicosene. 1-docosene. The alkene may be linear or branched.

In an embodiment of the present invention, the preparation of the semiconducting nanosized material comprising at least two components and/or the preparation of an magical size cluster is preferably achieved by a reaction mixture comprising a solvent and the solvent comprises at least one aromatic solvent, preferably toluene.

Regarding the preparation step of the semiconducting nanosized material comprising at least two components, alkanes and/or alkenes are preferred in view of the other solvents mentioned above, more preferable a squalane is used.

Regarding the preparation step of the InP MSC being useful as starting material for the preparation of the semiconducting nanosized material comprising at least two components aromatic solvents are preferred in view of the other solvents mentioned above, more preferable a toluene is used.

It can be provided that a purified III-V semiconducting nanosized material is provided in step a) and/or in step c). Preferably the InP MSC are purified as mentioned above and below before they are used as starting material for preparation of a semiconducting nanosized material comprising at least two components.

Preferably, the semiconducting nanosized material comprising at least two components, preferably obtained by a method comprising steps a) to d) has a diameter in the range of 1.0 to 6.0 nm, preferably 2.5 nm to 5.5 nm, more preferably 3.0 to 4.5 nm. The size is measured according to the method mentioned above and below (High Resolution Transmission Electron Microscopy; HRTEM) and is based on the arithmetic mean (number average). The semiconducting nanosized material comprising at least two components having a diameter in the range of 1.0 to 6.0 nm, preferably 2.5 nm to 5.5 nm, more preferably 3.0 to 4.5 nm is preferably used as a starting material for achieving a semiconducting nanosized material comprising at least three components as mentioned above and below in more detail.

In a preferred embodiment, the semiconducting nanosized material comprising at least two components is modified. This modification can be performed immediately after step d) of the method mentioned above. That is, the reaction composition obtained after step d) is used for the next steps. Furthermore, the reaction product of step d), especially the semiconducting nanosized material comprising at least two components, can be isolated and treated by further steps, e. g. purification steps as mentioned above and below.

In a specific embodiment, it can be provided that after step d) the steps e) and f) are preformed
e) providing a second precursor;
f) reacting the nanosized material obtained by step d) with the second precursor in order to achieve a semiconducting nanosized material comprising at least three components.

Preferably, the second precursor is a Zn, or a Cd source, preferably a material selected from one or more members of the group consisting of Zinc salts, Cadmium salts and mixtures thereof, preferably Zinc halides, Cadmium halides, Zinc carboxylates, Cadmium carboxylates and mixtures thereof, more preferably $ZnCl_2$, $ZnBr_2$, $ZnI_2$, $Zn(O_2CR)_2$, wherein R is $C_1$ to $C_{19}$ hydrocarbyl, even more preferably Zinc acetate, Zinc myristate, Zinc oleate, Zinc laurate, Zinc stearate, and Zinc iso-stearate, even more preferably Zinc oleate, and Zinc iso-stearate.

In a preferred embodiment, the III-V semiconducting nanosized material provided in step a) and the III-V semiconducting nanosized material added in step c) contain at most a low amount of Zn precursor, preferably at most a low amount of a second precursor, preferably the III-V semiconducting nanosized material provided in step a) and the III-V semiconducting nanosized material added in step c) contain essentially no Zn precursor, preferably essentially no second precursor. Preferably, the molar ratio of Zn to the element of the group III contained in the III-V semiconducting nanosized material provided in step a) and the element of the group III contained in III-V semiconducting nanosized material added in step c) is below 0.8, preferably below 0.7, more preferably below 0.5, even more preferably below 0.3, even more preferably below 0.1.

In an embodiment, the reaction steps e) to f) are performed as a batch. It can be provided that a composition comprising the second precursor is injected to the III-V semiconducting nanosized material comprising at least two components. Preferably, a composition comprising the second precursor is injected to the III-V semiconducting nanosized material in at least two portions.

In a further embodiment, it can be provided that the steps e) and f) are performed in a continuous flow reaction.

Preferably, the semiconducting nanosized material comprising least two components is reacted with the second precursor in concentration of at least 0.1 mg/ml, preferably at least 0.5 mg/ml, more preferably at least 1.0 mg/ml, based on the reaction composition.

Preferably, the semiconducting nanosized material comprising at least two components is reacted with the second precursor in a concentration in a range of from 0.5 to 200 mg/ml, more preferably from 1 to 100 mg/ml, even more preferably 1 to 50 mg/ml.

Preferably, the semiconducting nanosized material comprising at least two components is reacted with the second precursor wherein the molar ratio of the element of the group III, preferably comprised in the III-V semiconducting nanosized material, to the second precursor is in the range of 10:1 to 1:10, preferably 5:1 to 1:2, more preferably 4:1 to 3:2.

Preferably, the second precursor is reacted with the semiconducting nanosized comprising at least two components at a reaction temperature in the range from 250° C. to 500° C., preferably in the range from 280° C. to 450° C., more preferably it is from 300° C. to 400° C.

Preferably, the temperature of the reaction mixture wherein the second precursor is reacted with the III-V semiconducting nanosized material comprising at least two components, is kept in said temperature range for from 1 second to 120 minutes, preferably from 10 second to 60 minutes, more preferably from 30 seconds to 45 minutes, even more preferably from 60 seconds to 30 minutes, further more preferably from 120 seconds to 15 minutes, the most preferably from 5 minutes to 13 minutes.

In an embodiment of the present invention, the Zn concentration of the outer layer is preferably higher than the Zn concentration of the core.

Preferably, it can be provided that the semiconducting nanosized material comprising at least three components comprises an inner core consisting essentially of InP and an outer core of InZnP.

In a preferred embodiment, the semiconducting nanosized material comprising at least three components is modified. This modification can be performed immediately after step f) of the method mentioned above. That is, the reaction composition obtained after step f) is used for the next steps. Furthermore, the reaction product of step f), especially the semiconducting nanosized material comprising at least three components, can be isolated and treated by further steps, e. g. purification steps as mentioned above and below.

In a specific embodiment, it can be provided that the steps g) and h) are preformed
  g) providing a third cation precursor;
  h) reacting the semiconducting nanosized material comprising at least three components with the third cation precursor.

Preferably, the third cation precursor is a Ga source, preferably a material selected from Ga amines and/or Gallium salts, preferably Gallium halides, Gallium carboxylates mixtures thereof, more preferably Ga oleylamine, $GaCl_3$, $GaBr_3$, $GaI_3$, $Ga(O_2CR)_3$, wherein R is $C_1$ to $C_{19}$ even more preferably Gallium acetate, Gallium acetylacetonate, Gallium myristate, Gallium laurate, Gallium stearate, Gallium iso-stearate, and Gallium oleate.

In a specific embodiment, it can be provided that the semiconducting nanosized material comprising at least three components being obtained in step f) is purified before the semiconducting nanosized material comprising at least three components is reacted with a third cation precursor. In a further embodiment comprising at least three components being obtained in step f) is used without any specific reaction step (in situ).

In a specific embodiment, the whole amount of second precursor is added to a reaction mixture before a third cation precursor is provided to the reaction mixture. In an alternative embodiment, the second precursor and third cation precursor are provided and added to the reaction mixture alternatingly. In just another embodiment, the second precursor and third cation precursor are provided and added to the reaction mixture simultaneously. In another embodiment, the third cation precursor is present in the reaction mixture before any second precursor is added thereto.

In an embodiment, the reaction steps g) to h) are performed as a batch. It can be provided that a composition comprising the third cation precursor is injected to the III-V semiconducting nanosized material comprising at least three components as mentioned above and below. Preferably, a composition comprising the third cation precursor is injected to the III-V semiconducting nanosized material comprising at least three components in at least two portions.

In a further embodiment, the steps g) and h) are performed in a continuous flow reaction.

Preferably, the III-V semiconducting nanosized material comprising at least three components is reacted with the third cation precursor in a concentration of at least 0.1 mg/ml, preferably 0.5 mg/ml.

Preferably, the III-V semiconducting nanosized material comprising at least three components is reacted with the third cation precursor in a concentration in a range of from 0.5 to 30 mg/ml, more preferably from 1 to 20 mg/ml, even more preferably 1 to 15 mg/ml, most preferably 1 to 10 mg/ml.

According to a further embodiment, the nanosized material comprising at least three components and the third cation precursor are preferably mixed at a temperature below 150° C. and heated after the mixing. Preferably, the mixture of the nanosized material comprising at least three components and the third cation precursor are heated to a temperature in the range of 100° C. to 350° C., preferably 150° C. to 300° C., more preferably 200° C. to 260° C., preferably after the nanosized material comprising at least three components and the third cation precursor are preferably mixed at a temperature below 150° C.

In another embodiment, it can be provided that the composition comprising the third cation precursor is injected to the semiconducting nanosized material comprising at least three components at a temperature above 150° C., preferably above 180° C., more preferably above 200° C.

Preferably, the composition comprising the third cation precursor is injected to the III-V semiconducting nanosized material comprising at least three components at a temperature in the range from 150° C. to 500° C., preferably in the range from 180° C. to 400° C., more preferably it is from 200° C. to 400° C., further more preferably from 200° C. to 350° C.

In a specific embodiment of the present invention the temperature of the reaction mixture of the step, wherein a third cation precursor and a semiconducting nanosized material comprising at least three components are reacted is preferably kept in the temperature range for from 1 second to 7 hours, preferably from 30 seconds to 6 hours, more preferably from 2 minutes to 300 minutes, even more preferably from 10 minutes to 240 minutes, further more preferably from 15 minutes to 180 minutes, the most preferably from 30 minutes to 150 minutes.

Preferably, the reaction mixture comprises at least 0.01% by weight of the third cation precursor, more preferably at least 0.05% by weight, even more preferably at least 0.1% by weight, even more preferably at least 0.5% by weight. Preferably, the reaction mixture comprises at most 30% by weight of the third cation precursor, more preferably at most 20% by weight, even more preferably at most 15% by weight.

Preferably, the reaction mixture comprises the third cation precursor in a range of from 0.001 to 30% by weight, more preferably from 0.1 to 10% by weight, even more preferably 0.5 to 5% by weight, based on the total weight of the mixture.

According to one embodiment, wherein the third cation precursor is preferably added in multiple steps. In view of prior art particles having the same wavelength, the present particles comprise very high optical density and/or high quantum yield (QY).

According to a further embodiment the third cation precursor is preferably added in exactly one step. In view of prior art particles having the same wavelength, the particles being achieved by adding the third cation precursor in exactly one step show lower full width half maximum (FWHM) values.

In a further embodiment of the present invention, a third anion precursor is added for reacting the semiconducting nanosized material comprising at least three components with a third anion precursor, preferably a source of an element of the group 15 of the periodic table, preferably the element of the group 15 is P, As or a mixture of thereof. Preferably, the concentration the third anion precursor is above 0.001 mol/l, preferably above 0.003 mol/l, more preferably above 0.005 mol/l while the semiconducting nanosized material comprising at least three components is reacted with a third anion precursor.

Preferably, the molar ratio of third cation precursor to the third anion precursor is in the range of 10:1 to 1:10, more preferably 5:1 to 1:5, even more preferably 3:1 to 1:3.

Preferably, the concentration the third anion precursor is above 0.1 mg/ml, more preferably above 0.5 mg/ml, even more preferably above 1.0 mg/ml while the semiconducting nanosized material comprising at least three components is reacted with a third cation precursor.

This second embodiment, wherein a third anion precursor is added, preferably provides quantum dots having an absorption at a high wavelength and a low full width half maximum (FWHM). It should be noted that a controlled addition of a third anion precursor provides the opportunity to avoid an additional growth of InP parts in the layer achieved by the reaction step wherein the third precursor is reacted.

In a preferred embodiment, no third anion precursor is added for reacting the semiconducting nanosized material comprising at least three components with a third cation precursor. Preferably no third anion precursor, preferably no source of an element of the group 15 of the periodic table is added, preferably no source of P, As or a mixture of thereof, more preferably no source of P is added. Preferably, the molar ratio of third cation precursor to the third anion precursor is below 1:1, preferably below 10:1, more preferably below 100:1 while the semiconducting nanosized material comprising at least three components is reacted with a third cation precursor. Low concentration of the third anion precursor are preferably achieved by using purified starting materials, e.g. purified InP MSC or a purification step before the semiconducting nanosized material comprising at least three components is reacted with a third cation precursor.

The embodiment wherein no third anion precursor is added for reacting the semiconducting nanosized material comprising at least three components with a third cation precursor is preferred over the embodiment wherein a third anion precursor is added for reacting the semiconducting nanosized material comprising at least three components with a third anion precursor.

The embodiment wherein no third anion precursor is added for reacting the semiconducting nanosized material comprising at least three components with a third cation precursor provides improvements regarding full width half maximum (FWHM).

Embodiments comprising a low amounts of third anion precursor, preferably no source of third anion precursor while the semiconducting nanosized material comprising at least three components is reacted with a third cation precursor provide particles having low full width half maximum (FWHM), very high optical density and/or high quantum yield (QY).

Preferably, the semiconducting nanosized material comprising at least three components being obtained in step f) is reacted with the third cation precursor in a concentration of at least 0.1 mg/ml, preferably at least 0.5 mg/ml, more preferably at least 1.0 mg/ml.

Preferably, the semiconducting nanosized material comprising at least three components being obtained in step f) is reacted with the third cation precursor in a concentration in a range of from 0.5 to 30 mg/ml, more preferably from 1 to 20 mg/ml, even more preferably 1 to 15 mg/ml, most preferably 1 to 10 mg/ml.

In an embodiment of the present invention, the Zn concentration of the outer layer is preferably higher than the Zn concentration of the core.

Preferably, it can be provided that the semiconducting nanosized material comprising at least three components comprises an inner core consisting essentially of InP and an outer core of InZnP.

It can be provided that the molar ratio of the element of the group V, preferably comprised in the III-V semiconducting nanosized material, to the third cation precursor is above 1:6, preferably above 1:4, more preferably above 2:5, even more preferably above 1:2.

Preferably, the molar ratio of the element of the group V, preferably comprised in the III-V semiconducting nanosized material, to the third cation precursor is in the range of 1:10 to 100:1, preferably 1:4 to 10:1, more preferably 1:2 to 5:1.

According to a preferred embodiment, the molar ratio of the element of the group V to the third cation precursor is preferably based on the determination of the ratio of the elements in the particulate product of the reaction, preferably measured by Energy-dispersive X-ray spectroscopy (EDS). Before the EDS measurement is preformed, the particulate product is purified as mentioned above and below.

Preferably, the molar ratio of the element of the group III, preferably comprised in the III-V semiconducting nanosized material, to the third cation precursor is above 1:2, preferably above 1:1, more preferably above 2:1, even more preferably above 3:1; even more preferably the molar ratio of the element of the group III, preferably comprised in the III-V semiconducting nanosized material, to the third cation precursor is in the range of 1:10 to 100:1, preferably 1:1 to 40:1, more preferably 3:2 to 20:1.

According to a preferred embodiment, the molar ratio of the element of the group III to the third cation precursor is preferably based on the determination of the ratio of the elements in the particulate product of the reaction, preferably measured by Energy-dispersive X-ray spectroscopy (EDS). Before the EDS measurement is preformed, the particulate product is purified as mentioned above and below.

The preferred embodiments as mentioned above and below concerning a reaction comprising the steps a) to d), a) to f) and a) to h) for the production of nanosized material comprising desirable properties can be adopted and apply to all embodiments, respectively.

In another embodiment, a purification step is preferably performed for purifying a particulate material before performing an additional reaction step. That is, the III-V semiconducting nanosized material, preferably the magical size cluster being used as starting material and/or the semiconducting nanosized material comprising at least two components being obtainable by a method comprising steps a) to d), the semiconducting nanosized material comprising at least three components being obtainable by a method comprising steps a) to f), or the semiconducting nanosized material comprising at least three components being obtainable by a method comprising steps a) to h), is preferably purified before any subsequent reaction and/or modification is performed. The purification is described in more detail above and below.

The purification is preferably performed by adding a solvent to the mixture obtained in the first reaction step comprising a particulate material and preferably precipitating a particulate material.

The preparation of the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) is preferably achieved using a solvent. The solvent is not specifically restricted. Preferably, the solvent is selected from the compounds mentioned above. Preferably a non-coordinating solvent is used It can be provided that the preparation of the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) is achieved by a reaction mixture comprising a solvent and the solvent comprises at least one alkane and/or alkene having 6 to 46 carbon atoms, more preferably 8 to 40 carbon atoms, even more preferably 12 to 34 carbon atoms, most preferably 16 to 30 carbon atoms. Preferably, the semiconducting nanosized material comprising at least three components being obtainable by a method comprising steps a) to f) is achieved by a reaction mixture comprising a solvent and the solvent comprises at least one alkane and/or alkene having 6 to 46 carbon atoms, more preferably 8 to 40 carbon atoms, even more preferably 12 to 34 carbon atoms, most preferably 16 to 30 carbon atoms and the second precursor is a Zinc carboxylate having a high solubility, more preferably Zinc oleate, Zinc iso-stearate, Zinc stearate, even more preferably Zinc oleate, Zinc iso-stearate.

In a further embodiment if can be provided that the preparation of the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) is achieved by a reaction mixture comprising a solvent and the solvent comprises at least one alkene and/or alkane, preferably an alkene having 6 to 36 carbon atoms, more preferably 8 to 30 carbon atoms, even more preferably 12 to 24 carbon atoms, most preferably 16 to 20 carbon atoms. Preferably, the semiconducting nanosized material comprising at least three components being obtainable by a method comprising steps a) to h) is achieved by a reaction mixture comprising a solvent and the solvent comprises at least one alkene and/or alkane, preferably an alkene having 6 to 36 carbon atoms, more preferably 8 to 30 carbon atoms, even more preferably 12 to 24 carbon atoms, most preferably 16 to 20 carbon atoms and the third cation precursor is a Gallium carboxylate having a high solubility, more preferably Gallium iso-stearate, Gallium stearate, Gallium oleate.

In a further embodiment, the preparation of the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) is achieved in the presence of a ligand, preferably the reaction composition and/or a starting material comprises a ligand as mentioned above and below.

According to a further aspect of the method of the present invention, a shell of a semiconductor and/or an additional shell is grown onto the semiconducting nanosized material comprising at least two components being obtainable by a method comprising steps a) to d), the semiconducting nanosized material comprising at least three components being obtainable by a method comprising steps a) to f), or the semiconducting nanosized material comprising at least three components being obtainable by a method comprising steps a) to h) as mentioned above and below. That is, if the product of the steps a) to d), steps a) to f) and/or steps a) to h) is considered as a core particle, a shell is made onto that product. Furthermore, if the product of the steps a) to f) and/or steps a) to h) is considered as a core/shell particle, an additional shell is made onto the core/shell particle as obtained according to the steps a) to f) and/or steps a) to h) as mentioned above. That is in the second case a particle comprising at least two shells is achieved. The additional shell may comprise one or multiple layers. Furthermore, the additional shell may have an gradient structure. The shell of a semiconductor and/or an additional shell as mentioned above and below can be considered as outer shell. The outer shell may comprise one, two or more layers, preferably of ZnS, ZnSe and/or ZnSeS. Furthermore, the outer shell may comprise a concentration gradient of the different components.

The growing of a shell of a semiconductor and/or an additional shell is different to a reaction of the third cation precursor with the semiconducting nanosized material comprising at least three components being obtainable by a method comprising steps a) to f), a reaction of the second precursor with the semiconducting nanosized material comprising at least two components a) to d).

According to the present invention, the term "core/shell structure" means the structure having a core part and at least one shell part covering said core.

In some embodiments of the present invention, said core/shell structure can be core/one shell layer structure, core/double shells structure or core/multishell structure.

According to the present invention, the term "multishell" stands for the stacked shell layers consisting of three or more shell layers.

Each stacked shell layers of double shells and/or multishell can be made from same or different materials.

In some embodiments of the present invention, a quantum dot shell may comprise a shell of a semiconductor material comprising II-VI, III-V, or IV-IV semiconductors, or a combination of any of these.

In some embodiments, as a combination, ternary or quaternary materials of II, III, IV, V, VI materials of the periodic table can be used.

Preferably, the shell comprises or consists of a $1^{st}$ element of group 12 of the periodic table and a $2^{nd}$ element of group 16 of the periodic table, preferably, the $1^{st}$ element is Zn, and the $2^{nd}$ element is S, Se and/or the shell comprises or a consisting of a $1^{st}$ element of group 13 of the periodic table and a $2^{nd}$ element of group 15 of the periodic table, preferably, the $1^{st}$ element is In, and the $2^{nd}$ element is P, more preferably the shell comprises or a consisting of InP, GaP, ZnS, ZnSe or combinations of these materials, especially alloys of these materials, even more preferably ZnSe or ZnS or the shell comprises a mixture of ZnS and ZnSe. In an embodiment, the mixture of ZnS and ZnSe is achieved by a multi-layer structure comprising at least one layer of ZnS and a further layer of ZnSe. In a further embodiment the mixture of ZnS and ZnSe is achieved by a structure wherein ZnS and ZnSe are present in one layer (alloy of ZnSeS).

For example, CdSe/CdS, CdSeS/CdZnS, CdSeS/CdS/ZnS, ZnSe/CdS, CdSe/ZnS, InP/ZnS, ZnSe, ZnS, InP/ZnSe, InP/ZnSe/ZnS, InZnP/ZnS, InZnPS/ZnS, InZnP/ZnSe/ZnS, ZnSe/CdS, ZnSe/ZnS, GaP/ZnS, GaP/ZnSe, GaP/ZnSe/ZnS, GaZnP/ZnS, GaZnPS/ZnS, GaZnP/ZnSe/ZnS, InGaP/ZnS, InGaP/ZnSe, InGaP/ZnSeS, InGaP/ZnSe/ZnS, InGaP/ZnSe/ZnSeS/ZnS, InGaP/ZnSeS/ZnS. ZnSe/ZnS, ZnSe/ZnSeS/ZnS, only ZnS. InGaZnP/ZnSe/ZnS, InGaZnP/ZnS, InGaZnP/ZnSe/ZnSeS/ZnS, InGaZnP/ZnSeS/ZnS, InGaZnP/ZnSe/ZnS, or combination of any of these, can be used preferably. Preferably, the semiconducting material does not comprise Cd, more preferably the semiconducting material of the shell comprises ZnS, ZnSe and/or ZnSeS.

In some embodiments of the present invention, said shell comprises group 12 and group 16 elements of the periodic table. Preferably the shell comprises InP, ZnS, ZnSe, ZnSeS and/or ZnSeS/ZnS, preferably ZnS, ZnSe, ZnSeS and/or ZnSeS/ZnS. Preferred embodiments regarding the shell are specified above and below. Especially preferred embodiments comprises an alloy shell of ZnSeS and/or a multilayer structure comprising layers of ZnS, ZnSe and/or ZnSeS.

According to a specific embodiment, the shell preferably comprises at least 10% by weight, more preferably at least 20% by weight, even more preferably at least 40% by weight, even more preferably at least 60% by weight and most preferably at least 80% by weight ZnS based on the total weight of the shell. In a further embodiment, the shell preferably comprises at least 20% by weight, more preferably at least 40% by weight, even more preferably at least 60% by weight, even more preferably at least 80% by weight and most preferably at least 90% by weight ZnS in a specific layer of the shell.

According to a further embodiment, the shell preferably comprises at least 10% by weight, more preferably at least 20% by weight, even more preferably at least 40% by weight, even more preferably at least 60% by weight and most preferably at least 80% by weight and most preferably at least 80% by weight ZnSeS based on the total weight of the shell. In a further embodiment, the shell preferably comprises at least 20% by weight, more preferably at least 40% by weight, even more preferably at least 60% by weight, even more preferably at least 80% by weight and most preferably at least 90% by weight ZnSeS in a specific layer of the shell.

According to a further embodiment, the shell preferably comprises at least 10% by weight, more preferably at least 20% by weight, even more preferably at least 40% by weight, even more preferably at least 60% by weight and most preferably at least 80% by weight ZnSe based on the total weight of the shell. In a further embodiment, the shell preferably comprises at least 20% by weight, more preferably at least 40% by weight, even more preferably at least 60% by weight, even more preferably at least 80% by weight and most preferably at least 90% by weight ZnSe in a specific layer of the shell.

It can be provided that the shell of a semiconductor being grown in a continuous flow reaction onto the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h).

In a further embodiment, the growing of the shell is performed as a batch.

Preferably the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) is purified before a shell of a semiconductor is grown onto the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h). Preferably, the purification is performed by adding a solvent to the mixture and preferably precipitating the semiconducting nanosized material being obtained by reacting the semiconducting nanosized material comprising at least three components with a third cation precursor as mentioned above and below.

In an embodiment of the invention, the shell preferably has a thickness in the range of 0.1 nm to 15 nm, preferably 0.3 nm to 10 nm, more preferably 0.5 to 5.0 nm, measured by taking images on a 120 kV TEM and measuring the size, e.g. the diameter of the quantum material for a sample of more than 50 particles and provided as arithmetic mean (number average). The measurement is preferably performed using imageJ software or the software mentioned below. Preferably, the shell thickness is calculated by subtracting the shelled particle thickness from the literature value of the MSCs e. g. 1.0 or 1.3 nm and/or the particle being used for shelling. Furthermore, the particle size of the shelled particles can be determined as mentioned above before shelling.

In some embodiments of the invention, the size of the overall structures of the quantum dots, is from 1 nm to 100 nm, more preferably, it is from 1.5 nm to 30 nm, even more preferably, it is from 2 nm to 10 nm, even more preferably, it is from 3 nm to 8 nm. The size is measured according to the method mentioned above and below (High Resolution Transmission Electron Microscopy; HRTEM) and is based on the arithmetic mean (number average).

The starting material for a preparing a semiconducting nanosized material having a shell preferably comprises a ligand as mentioned above and below. Preferably, the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) comprises a ligand, preferably a carboxylate ligand, more preferably a carboxylate ligand having 2 to 30 carbon atoms, preferably 4 to 26 carbon atoms, even more preferably 8 to 22 carbon atoms, most preferably 10 to 18 carbon atoms, even more preferably a carboxylate ligand selected from the group consisting of myristate, palmitate, laurate, stearate, iso-stearate, oleate.

The preparation of the shell is preferably achieved using a solvent. The solvent is not specifically restricted. Preferably, the solvent is selected from aldehydes, alcohols, ketones, ethers, esters, amides, sulfur compounds, nitro compounds, phosphorus compounds, hydrocarbons, halogenated hydro-carbons (e.g. chlorinated hydrocarbons), aromatic or heteroaromatic hydrocarbons, halogenated aromatic or heteroaromatic hydrocarbons and/or (cyclic) siloxanes, preferably cyclic hydrocarbons, terpenes, epoxides, ketones, ethers and esters. Preferably a non-coordinating solvent is used.

Preferably, an alkane, more preferably a squalane is used as a solvent for achieving a shell. Preferably, an alkane having 6 to 46 carbon atoms, more preferably 8 to 40 carbon atoms, even more preferably 12 to 34 carbon atoms, most preferably 16 to 30 carbon atoms is used as a solvent. More preferably, the alkane being used as a solvent is a decane, dodecane, tetradecane, hexadecane, octadecane, eicosane. docosane, tetracosane, hexamethyltetracosane. The alkane may be linear or branched with branched alkanes such as squalane being preferred In an embodiment of the present invention, the preparation of the shell is preferably achieved by a reaction mixture comprising a solvent and the solvent comprises at least one alkene, preferably an alkene having 6 to 36 carbon atoms, more preferably 8 to 30 carbon atoms, even more preferably 12 to 24 carbon atoms, most preferably 16 to 20 carbon atoms. More preferably, the alkene is a 1-alkene, such as 1-decene, 1-dodecene, 1-Tetradecene, 1-hexadecene, 1-octadecene, 1-eicosene. 1-docosene. The alkene may be linear or branched.

In a further embodiment of the present invention, the preparation of the shell is preferably achieved by a reaction mixture comprising a solvent and the solvent comprises at least one phosphorus compound, such as phosphine compounds, preferably alkyl phosphine compounds having 3 to 108 carbon atoms, phosphine oxide compounds, preferably alkyl phosphine oxide having 3 to 108 carbon atoms and/or phosphonate compounds, more preferably an alkyl phosphonate compounds having 1 to 36 carbon atoms, preferably 6 to 30 carbon atoms, even more preferably 10 to 24 carbon atoms, most preferably 12 or 20 carbon atoms in the alkyl group. Preferably, Trioctylphosphine (TOP) is used as a solvent for the preparation of a shell.

Regarding the preparation step of the shell, alkenes, e. g. octadecene, and/or alkanes, e. g. squalane, are preferred in view of the other solvents mentioned above. In a further preferred embodiment, the solvent for the preparation of the shell comprises a mixture of an alkene and a phosphorus compound. In another preferred embodiment, the solvent for the preparation of the shell comprises a mixture of an alkane and a phosphorus compound.

Preferably, the reaction mixture for the preparation of the shell comprises at least 10% by weight of a solvent, more preferably at least 50% by weight, even more preferably at least 70% by weight, even more preferably at least 90% by weight. The residual is provided by the further components of the reaction mixture as described above and below.

Preferably, the preparation of the shell is achieved by a reaction mixture comprising a solvent and the solvent exhibits a boiling point of at least 150° C., preferably of at least 200° C., more preferably of at least 250° C., even more preferably of at least 300° C.

Preferably, the preparation of the shell is achieved at a temperature above 110° C., preferably in the range of 110 to 500° C., more preferably above 150° C., even more preferably above 200° C. and most preferably above 250° C. In an embodiment of the present invention, the preparation of the shell is preferably achieved at a temperature in the range of 120 to 450° C., more preferably in the range of 150 to 400° C., even more preferably in the range of 180 to 360° C.

Preferably, the shell is prepared by using a first cation shell precursor and the first cation shell precursor comprises an element of group 12 of the periodic table, preferably Zn, or the first cation shell precursor comprises an element of group 13 of the periodic table, preferably In.

In a further embodiment, the first cation shell precursor comprises a Zn compound and/or an In compound, preferably a Zn carboxylate, more preferably a zinc carboxylate having 2 to 30 carbon atoms, preferably 4 to 24 carbon atoms, even more preferably 8 to 20 carbon atoms, most preferably 10 to 26 carbon atoms, even more preferably a zinc carboxylate selected from the group consisting of Zn myristate, Zn palmitate, Zn laurate, Zn stearate, Zn isostearate, Zn oleate and/or an indium carboxylates, more preferably indium carboxylates having 2 to 30 carbon atoms, preferably 4 to 24 carbon atoms, even more preferably 8 to 20 carbon atoms, most preferably 10 to 16 carbon atoms even more preferably a indium carboxylate selected from the group consisting of In myristate, In palmitate, In laurate, In stearate, In oleate.

It can be provided that the shell is prepared by using a first anion shell precursor and the first anion shell precursor comprises an element of group 16 of the periodic table, preferably the first anion shell precursor comprises S and/or Se, or the first anion shell precursor comprises an element of group 15 of the periodic table, preferably the first anion shell precursor comprises P.

Preferably, the first anion shell precursor comprises a S compound, preferably a sulfur solution, a sulfur suspension, sulfur complex, a alkylthiol, e. g. octanethiol, dodecanethiol, a alkylsilyl sulfur, and/or a alkylsilyl sulfur, e. g. bis(trimethyl silyl) sulfur, a Se compound, preferably a Se solution, Se, selenium complex suspension, alkylselenol, e. g. octaneselenol, and/or a alkylsilyl selenium, e. g. bis(trimethyl silyl) selenium, and/or an P compound or complex, preferably an alkylsilyl phosphine more preferably tris(trimethylsilyl) phosphine.

Preferably, the first cation shell precursor, preferably Zn is present in the reaction mixture for the preparation of the shell before the first anion shell precursor, preferably comprising S and/or Se is added.

Preferably, the first cation shell precursor, preferably Zn is present in the reaction mixture for the preparation of the shell before the first anion shell precursor, preferably comprising S and/or Se is added and after adding the first anion shell precursor no additional first cation shell precursor, preferably no Zn is added.

In a specific embodiment of the present invention, the shell is prepared by mixing the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) and a first cation shell precursor and heating up the obtainable mixture and then adding a first anion shell precursor, preferably the first cation shell precursor comprises an element of group 12 of the periodic table and the first anion shell precursor comprises an element of group 16 of the periodic table, preferably, the first cation shell precursor comprises Zn, and the first anion shell precursor comprises S and/or Se, or the first cation shell precursor comprises an element of group 13 of the periodic table and the first anion shell precursor comprises an element of group 15 of the periodic table, preferably, the first cation shell precursor comprises In, and the first anion shell precursor comprises P. Preferred embodiments regarding the first cation shell precursor and first anion shell precursor concerning the preparation of the shell are provided below.

In the embodiment wherein a mixture of a first cation shell precursor and the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) as mentioned above and below is made and heated up, the mixture is preferably made and maintained at a temperature below 150° C., more preferably below 100° C., even more preferably below, 60° C. The heating of the mixture before adding the first anion shell precursor is preferably achieved at a high energy input. The addition of the first anion shell precursor is preferably achieved before the high reaction temperatures as mentioned above and below are achieved. Preferably, the first anion shell precursor is added to the reaction mixture at a temperature in the range of 60° C. to 300° C., more preferably 70° C. to 280° C. and even more preferably at a range in the temperature of 80° C. to 260° C.

In a further embodiment of the present invention, the shell is prepared by mixing the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) and a first anion shell precursor and heating up the obtainable mixture and then adding a first cation shell precursor, preferably the first cation shell precursor comprises an element of group 12 of the periodic table and the first anion shell precursor comprises an element of group 16 of the periodic table, preferably, the first cation shell precursor comprises Zn, and the first anion shell precursor comprises S or Se, or the first cation shell precursor comprises an element of group 13 of the periodic table and the first anion shell precursor comprises an element of group 15 of the periodic table, preferably, the first cation shell precursor comprises In, and the first anion shell precursor comprises P. Preferred embodiments regarding the first cation shell precursors and first anion shell precursor concerning the preparation of the shell are provided below.

In the embodiment wherein a mixture of a first anion shell precursor and a semiconducting nanosized material obtainable by reacting a semiconducting nanosized material with a third cation precursor as mentioned above and below is made and heated up, the mixture is preferably made and maintained at a temperature below 150° C., more preferably below 100° C., even more preferably below, 60° C. The heating of the mixture before adding the first cation shell precursor is preferably achieved at a high energy input. The addition of the first cation shell precursor is preferably achieved before the high reaction temperatures as mentioned above and below are achieved. Preferably, the first cation shell precursor is added to the reaction mixture at a temperature in the range of 10° C. to 200° C., more preferably 20° C. to 120° C. and even more preferably at a range in the temperature of 30° C. to 100° C.

In a preferred embodiment of the present invention, the shell is preferably prepared by adding a first anion shell precursor to a mixture comprising a first cation shell precursor and the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h). In a preferred embodiment, the reaction mixture obtainable after the steps a) to d), steps a) to f), and/or steps a) to h) is used and the first anion shell precursor is added thereto at a temperature above 110° C., preferably in the range of 110 to 500° C., more preferably above 150° C., even more preferably above 180° C. In an embodiment of the present invention, the first anion shell precursor is preferably added to the mixture comprising a first cation shell precursor and the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) at a temperature in the range of 120 to 350° C., more preferably in the range of 150 to 300° C., even more preferably in the range of 180 to 260° C. In this specific embodiment, no specific cooling step is preferably performed.

In a further embodiment of the present invention, the shell is preferably prepared by mixing a first cation shell precursor, a first anion shell precursor and the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) as mentioned above and below and heating up the obtainable mixture. Preferably, the first cation shell precursor comprises an element of group 12 of the periodic table and the first anion shell precursor comprises an element of group 16 of the periodic table. Preferably, the first cation shell precursor comprises Zn, and the first anion shell precursor comprises S and/or Se, or the first cation shell precursor comprises an element of group 13 of the periodic table and the first anion shell precursor comprises an element of group 15 of the periodic table, preferably, the first cation shell precursor comprises In, and the first anion shell precursor comprises P. Preferred embodiments regarding the first cation shell precursors and first anion shell precursor concerning the preparation of the shell are provided below.

Preferably, the semiconductor precursor comprises a Zn compound and/or an In compound, preferably a Zn carboxylate, more preferably a zinc carboxylate having 2 to 30 carbon atoms, preferably 4 to 26 carbon atoms, even more preferably 8 to 22 carbon atoms, most preferably 10 to 18 carbon atoms, even more preferably a zinc carboxylate selected from the group consisting of Zn myristate, Zn palmitate, Zn laurate, Zn stearate, Zn oleate, Zn iso-stearate and/or an indium carboxylates, more preferably indium carboxylates having 2 to 30 carbon atoms, preferably 4 to 24 carbon atoms, even more preferably 8 to 20 carbon atoms, most preferably 10 to 18 carbon atoms even more preferably a indium carboxylate selected from the group consisting of In myristate, In palmitate, In laurate, In stearate, In iso-stearate, In oleate.

Preferably, the semiconductor precursor comprises a S compound, preferably a sulfur solution, a sulfur suspension, a sulfur complex, a alkylthiol, e. g. octanethiol, a alkylsilyl sulfur, and/or a alkylsilyl sulfur, e. g. bis(trimethyl silyl) sulfur, a Se compound, preferably a Se solution, Se suspension, alkylselenol, e. g. octaneselenol, and/or a alkylsilyl selenium, e. g. bis(trimethyl silyl) selenium, and/or an P compound, preferably an alkylsilyl phosphine more preferably tris(trimethylsilyl)phosphine.

Preferably a sulfur solution, more preferably a S solution comprising a phosphorus containing solvent, e.g. trioctylphosphine is used as a semiconductor precursor.

Preferably a selenium solution, more preferably a Se solution comprising a phosphorus containing solvent, e.g. trioctylphosphine is used as a semiconductor precursor Preferably, a Se solution and/or suspension comprising a hydrocarbon solvent, e.g. an 1-alkene, such as 1-octadecene and/or an organic phosphine compounds, preferably alkyl phosphine compounds having 1 to 30 carbon atoms, preferably 1 to 10 carbon atoms, even more preferably 1 to 4 carbon atoms, most preferably 1 or 2 carbon atoms in the alkyl groups or aryl phosphine compounds having 6 to 30 carbon atoms, preferably 6 to 18 carbon atoms, even more preferably 6 to 12 carbon atoms, most preferably 6 or 10 carbon atoms in the aryl groups is used as a semiconductor precursor.

Preferably, an organic phosphine compound as mentioned above regarding the InP precursor, e.g. tris(trimethylsilyl) phosphine and similar materials having an aryl, and/or alkyl group instead of the methyl unit, such as tris(triphenylsilyl) phosphine, tris(triethylsilyl)phosphine, tris(diphenylmethylsilyl)phosphine, tris(phenyldimethylsilyl)phosphine, tris(triphenylsilyl)phosphine, tris(triethylsilyl)phosphine, tris (diethylmethylsilyl)phosphine, tris(ethyldimethylsilyl) phosphine dissolved in an organic solvent, preferably octadecene, e. g. 1-octadecene or squalane is used as a semiconductor precursor.

Preferably, the preparation of the shell is achieved at a temperature above 110° C., preferably in the range of 110 to 500° C., more preferably above 150° C., even more preferably above 200° C. and most preferably above 250° C. In an embodiment of the present invention, the preparation of the shell is preferably achieved at a temperature in the range of 120 to 450° C., more preferably in the range of 150 to 400° C., even more preferably in the range of 180 to 360° C.

It can be provided that at least a first cation shell precursor and a first anion shell precursor, optionally in a solvent, are used to form a shell layer onto the semiconducting nanosized material being obtained a method comprising steps a) to d), the semiconducting nanosized material comprising at least three components being obtainable by a method comprising steps a) to f), the semiconducting nanosized material comprising at least three components being obtainable by a method comprising steps a) to h), wherein said first cation shell precursor is a salt and/or a complex of an element of the group 12 of the periodic table and the first anion shell precursor is a source of an element of the group 16 of the periodic table, more preferably said first cation shell precursor is selected from one or more member s of the group consisting of Zn-stearate, Zn-myristate, Zn-oleate, Zn-laurate, Zn-palmitate, Zn-acetylacetonate, Cd-stearate, Cd-myristate, Cd-oleate, Cd-laurate, Cd-palmitate, Cd-acetylacetonatQ a metal halogen represented by chemical formula (IV) and a metal carboxylate represented by chemical formula (V), $$MX^2_n \qquad (IV)$$

wherein M is $Zn^{2+}$, or $Cd^{2+}$, preferably M is $Zn^{2+}$, $X^2$ is a halogen selected from the group consisting of $Cl^-$, $Br^-$ and $I^-$, n is 2, $$[M(O_2CR^1)(O_2CR^2)] \qquad (V)$$

wherein M is $Zn^{2+}$, or $Cd^{2+}$, preferably M is $Zn^{2+}$;

$R^1$ is a linear alkyl group having 1 to 30 carbon atoms, a branched alkyl group having 4 to 30 carbon atoms, a linear alkenyl group having 2 to 30 carbon atoms, or a branched alkenyl group having 4 to 30 carbon atoms, preferably $R^1$ is a linear alkyl group having 1 to 30 carbon atoms, or a linear alkenyl group having 2 to 30 carbon atoms, more preferably, $R^1$ is a linear alkyl group having 5 to 25 carbon atoms, or a linear alkenyl group having 6 to 25 carbon atoms, even more preferably $R^1$ is a linear alkyl group having 10 to 20 carbon atoms, or a linear alkenyl group having 10 to 20 carbon atoms, furthermore preferably $R^1$ is a linear alkenyl group having 10 to 20 carbon atoms, $R^2$ is a linear alkyl group having 1 to 30 carbon atoms, a branched alkyl group having 4 to 30 carbon atoms, a linear alkenyl group having 2 to 30 carbon atoms, or a branched alkenyl group having 4 to 30 carbon atoms, preferably $R^2$ is a linear alkyl group having 1 to 30 carbon atoms, or a linear alkenyl group having 2 to 30 carbon atoms, more preferably $R^2$ is a linear alkyl group having 5 to 25 carbon atoms, or a linear alkenyl group having 6 to 25 carbon atoms, even more preferably $R^2$ is a linear alkyl group having 10 to 20 carbon atoms, or a linear alkenyl group having 10 to 20 carbon atoms, furthermore preferably $R^2$ is a linear alkenyl group having 10 to 20 carbon atoms, and preferably said anion shell precursor is selected from one or more members of the group consisting of Trioctylphosphine:Se, Tributylphosphine:Se, selenols, Trioctylphosphine::S, Tributylphosphine:S, and thiols, e.g. alkyl thiols. The Se component could also be provided as selenol, preferably an alkyl selenol.

Preferably, the molar ratio of Group 12 elements in the shell precursors used in the shelling step to the Group 13 elements in the semiconducting material being shelled and used in the shelling step is 0.01 or more, preferably 0.2 or more, preferably in the range from 0.01 to 20, more preferably from 0.2 to 10, even more preferably from 0.4 to 6.

According to a preferred embodiment, the molar ratio of Group 12 elements to the Group 13 elements in the semiconducting material being shelled is preferably based on the determination of the ratio of the elements in the particulate product of the reaction, preferably measured by Energy-dispersive X-ray spectroscopy (EDS). Before the EDS measurement is preformed, the particulate product is purified as mentioned above and below.

In a preferred embodiment, the molar ratio of Group 12 elements, preferably Zn to the Group 13 elements, preferably In after the reaction with a third cation precursor is in the range from 0.01 to 20, more preferably from 0.2 to 10, even more preferably from 0.2 to 1. After the shelling step the molar ratio of Group 12 elements, preferably Zn to the Group 13 elements, preferably In after the reaction with a third cation precursor is in the range from 0.1 to 20, more preferably from 0.5 to 10, even more preferably from 0.8 to 8.

Furthermore, it can be provided said first anion shell precursor and a second anion shell precursor are added sequentially in the shelling step.

Preferably, said first anion shell precursor is Trioctylphosphine:Se, or Tributylphosphine:Se, or selenol, preferably an alkyl selenol and the second anion shell precursor is Trioctylphosphine:S, Tributylphosphine:S, or a thiol e.g. alkyl thiol.

Preferably, the shelling step is carried out at the temperature in the range from 150° C. to 350° C., preferably in the range from 160° C. to 340° C., more preferably in the range from 170° C. to 330° C., even more preferably from 180° C. to 320° C.

In an embodiment, a first anion shell precursor and a second anion shell precursor are preferably added sequentially in the shelling step.

In a further embodiment, a first anion shell precursor and a second anion shell precursor are added alternatingly in the shelling step.

In another embodiment, a first anion shell precursor and a second anion shell precursor are added simultaneously in the shelling step.

In another aspect, the present invention also relates to a method for preparing quantum dots comprising a core/shell structure, wherein the method preferably comprises following steps (a), (b) and (c) in this sequence.
 (a) synthesis of a core in a solution,
 (b) removing the extra ligands from the core
 (c) coating the core with at least one shell layer using said solution obtained in step (b).

In some embodiments of the present invention, the surface of the quantum dots can be over coated with one or more kinds of surface ligands.

Without wishing to be bound by theory it is believed that such a surface ligands may lead to disperse the nanosized material in a solvent more easily. In addition, the surface ligand may improve the features of the quantum dots such as efficiency, preferably energy efficiency, quantum yield, wavelength of the peak maximum and full width half maximum (FWHM).

According to a specific embodiment of the method of the present invention, the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) being used as starting material for the shelling reaction preferably comprises a ligand, preferably a carboxylate ligand, more preferably a carboxylate ligand having 2 to 30 carbon atoms, preferably 4 to 26 carbon atoms, even more preferably 8 to 22 carbon atoms, most preferably 10 to 18 carbon atoms, even more preferably a carboxylate ligand selected from the group consisting of myristate, palmitate, laurate, stearate, iso-stearate, oleate.

In a specific embodiment of the present invention, the semiconducting nanosized material comprising at least two components and/or any nanosized material being produced or used to obtain the semiconducting nanosized material can be purified. This purification can be done as intermediate step or to obtain a purified quantum dots according to the present invention.

According to a special embodiment, the purification can be achieved by dispersing 0.1 to 10 equivalents of the crude solution in 1 equivalent of a solvent (by volume), preferably a hydrocarbon solvent, e. g. toluene, hexane, pentane or chloroform. Then, 0.5 to 20 equivalents (by volume) of a cleaning composition such as a ketone, alcohol, preferably acetone, methanol, ethanol or propanol, more preferably an alcohol, e. g. ethanol is preferably added to the composition. The resultant suspension is preferably centrifuged for a time and at a speed sufficient for a useful precipitation. E.g. good results are achieved with 5 min at a speed of 5000 rpm.

In some embodiments of the present invention, the cleaning composition comprises one compound selected from one or more members of the group consisting of ketones, such as, methyl ethyl ketone, acetone, methyl amyl ketone, methyl isobutyl ketone, and cyclohexanone; alcohols, such as, methanol, ethanol, propanol, butanol, hexanol, cyclo hexanol, ethylene glycol; and pentane; halogenated hydrocarbons, such as chloroform; xylene and toluene.

In a preferred embodiment of the present invention, the cleaning composition comprises three parts the crude solution with the QDs, the solvent and the anti-solvent. The solvent is typically a non-polar compound preferably an alkane or a benzene derivative such as toluene or a halogenated hydrocarbon, more preferably toluene, chloroform, hexane and pentane. The anti-solvent is typically a polar compound such as an alcohol, ester or nitrogen containing compound, preferably methanol, ethanol, isopropanol, butanol, ethyl acetate and acetonitrile. The ratios of the crude, solvent and anti-solvent are in the ranges of 2.5:2.5:1 to 1:20:80.

In a preferred embodiment of the present invention, the cleaning composition comprises one or more of ketones to more effectively remove unreacted precursors from the composition comprising a particulate material as mentioned above or any other reaction composition and remove e. g. the ligands leftovers.

More preferably, the cleaning composition contains one or more of alcohols selected from the group consisting of methanol, ethanol, propanol, butanol, pentanol and cyclohexanol, and one more solvent selected from hydrocarbons, preferably aromatic hydrocarbons, e. g. toluene to remove unreacted core precursors from the composition comprising a particulate material as mentioned above or any other reaction composition and remove e. g. the ligands leftovers in the solution effectively. The mixing ratio is preferably in the ranges as provided above.

More preferably, the cleaning removes the extra ligands and the unreacted precursor.

In a preferred embodiment, the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) or the semiconducting nanosized material comprising a shell is subjected to a surface treatment with a crystal binding agent, preferably a methoxy polyethyleneglycol thiol or alkyl thiol.

In another aspect, the present invention further relates to the use of the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h), preferably the quantum dots (QD) of the present invention, the composition of the present invention or the formulation of the present invention in an electronic device, optical device or in a biomedical device.

A further subject matter of the present invention are the semiconducting nanosized material comprising at least two components being obtainable by a method comprising steps a) to d), the semiconducting nanosized material comprising at least three components being obtainable by a method comprising steps a) to f), the semiconducting nanosized material comprising at least three components being obtainable by a method comprising steps a) to h) or the semiconducting nanosized material comprising a shell, preferably quantum dots (QD) being obtainable by a method of the present invention as described above and below.

According to a preferred embodiment, the semiconducting nanosized material comprising high optical density, preferably the quantum dots may comprise a core/shell structure. Consequently, the QD may comprise a shell of a semiconductor.

Quantum dots (QD) are well known in the art as described above. Conventionally QD are a nanosized light emitting semiconductor material.

According to the present invention, the term "nanosized" means the size in between 0.1 nm and 999 nm.

Thus, according to the present invention, the term "a nanosized light emitting semiconductor material" is taken to mean that the light emitting material which size of the overall diameter is in the range from 0.5 nm to 999 nm. And in case of the material has elongated shape, the length of the overall structures of the light emitting material is in the range from 0.5 nm to 999 nm.

According to the present invention, the term "nano sized" means the size of the semiconductor material itself without ligands or another surface modification, which can show the quantum size effect.

According to the present invention, a type of shape of the core of the nanosized light emitting material, and shape of the nanosized light emitting material to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped nanosized light emitting materials can be synthesized.

A further subject matter of the present invention is a semiconducting light emitting nanosized material wherein the semiconducting light emitting nanosized material exhibit a peak maximum in the photoluminescence spectrum at a wavelength above 600 nm and the semiconducting light emitting nanosized material has a full width half maximum (FWHM) of at most 60 nm measured at 25° using a toluene solution, preferably a full width half maximum (FWHM) in the range of 30 to 55 nm, more preferable 30-50 nm most preferably 35-47 nm, preferably the semiconducting light emitting nanosized material comprise a center area of InP, more preferably the center area of InP comprises a diameter in the range of 1.0 to 6.0 nm, preferably 2.5 nm to 5.5 nm, more preferably 3.0 to 4.5 nm.

Preferably, the semiconducting light emitting nanosized material exhibits an Optical density per mg of at least 1.0, preferably at least 1.2, more preferably at least 1.4. The Optical density per mg can be achieved as mentioned in the Examples.

Preferably, the semiconducting light emitting nanosized material exhibits an Optical density per mg of at least 1.7, preferably at least 1.9, more preferably at least 2.0, even more preferably at least 2.1 based on inorganics. The Optical density per mg based on inorganics can be achieved as mentioned in the Examples.

In some embodiments of the present invention, the semiconducting nanosized material, preferably quantum dots (QD) preferably have a relative quantum yield of at least 30%, preferably at least 40%, more preferably at least 50% and even more preferably at least 60% measured by calculating the ratio of the emission counts of the QD and the dye DCM (CAS 51325-91-8) and multiplying by the QY of the dye (43.5%) measured at 25° C.

In some embodiments of the present invention, the semiconducting nanosized material, preferably quantum dots (QD) preferably have a relative quantum yield of at most 95%, more preferably at most 90%, even more preferably at most 85% and even more preferably at most % measured by calculating the ratio of the emission counts of the QD and the dye DCM (CAS 51325-91-8) and multiplying by the QY of the dye (43.5%) measured at 25° C.

In specific embodiments of the present invention, the semiconducting nanosized material, preferably quantum dots (QD) preferably have a relative quantum yield in the range of 25% to 95%, more preferably in the range of 40 to 90%, even more preferably in the range of 50 to 85% and even more preferably in the range of 60 to 85% measured by calculating the ratio of the emission counts of the QD and the dye DCM (CAS 51325-91-8) and multiplying by the QY of the dye (43.5%) measured at 25° C.

Further details for measuring the QY are provided above concerning the dye DCM dye (4-(Dicyanomethylene)-2-methyl-6-(4-dimethylaminostyryl)-4H-pyran; CAS 51325-91-8) is preferably used for red particles preferably having a peak maximum in the photoluminescence spectrum at a wavelength in the range of above 580 nm, preferably in the range above 580 nm to 800 nm as disclosed in more detail below.

The relative quantum yield is preferably calculated using absorbance and emission spectrum (excited at 450 nm), obtained using Shimadzu UV-1800 and Jasco FP-8300 spectrophotometer, using the following formula, with DCM (CAS 51325-91-8) in ethanol was used as a reference, with a quantum yield of 43.5%

$$QY = QY_{ref} \frac{n^2}{n_{ref}^2} \times \frac{I}{A} \times \frac{A_{ref}}{I_{ref}}$$

wherein the symbols have the following meaning
QY=Quantum Yield of the sample
$QY_{ref}$=Quantum Yield of the reference/standard
n=the refractive index of the sample solvent (especially ethanol)
I=the integral of the sample emission intensity as measured on the Jasco. Calculated as $\int I \, dv$ with I=intensity, v=wavelength.
A=is the percentage absorbance of the sample. The percentage of the sampling light that the sample absorbs.
$I_{ref}$=the integral of the reference emission intensity as measured on the Jasco. Calculated as $\int I \, dv$ with I=intensity, v=wavelength.
$A_{ref}$=is the percentage absorbance of the reference. The percentage of the sampling light that the reference absorbs.

The absorbance and emission spectrum is achieved at a temperature of about 25° C.

In some embodiments of the present invention, the semiconducting nanosized material, preferably quantum dots (QD) preferably exhibit an absolute quantum yield of at least 30%, preferably at least 40%, more preferably at least 50% and even more preferably at least 60% using an appropriate measurement system (Hamamatsu Quantaurus) and measured at 25° C. (excitation 450 nm).

In some embodiments of the present invention, the semiconducting nanosized material, preferably quantum dots (QD) preferably exhibit an absolute quantum yield of at most 95%, more preferably at most 90%, even more preferably at most 85% and even more preferably at most 80% using an appropriate measurement system (Hamamatsu Quantaurus) and measured at 25° C. (excited 450 nm).

In specific embodiments of the present invention, the semiconducting nanosized material, preferably quantum dots (QD) preferably have an absolute quantum yield in the range of 25% to 95%, more preferably in the range of 40 to 90%, even more preferably in the range of 50 to 85% and even more preferably in the range of 60 to 85% using an appropriate measurement system (Hamamatsu Quantaurus) and measured at 25° C. (excited 450 nm).

In a specific embodiment, the semiconducting nanosized material, preferably quantum dots (QD) has a full width half maximum (FWHM) of at most 80 nm, preferably of at most 60 nm measured at 25° using a toluene solution, preferably a full width half maximum (FWHM) in the range of 20 to 50 nm, more preferable 25 to 47 nm most preferably 30 to 47 nm at 25° using a toluene solution.

Preferably, the determination of the full width half maximum (FWHM) is made with an appropriate data base preferably comprising at least 10, more preferably at least 20 and even more preferably at least 50 data points. The determination is preferably performed by using LabVIEW Software (LabVIEW 2017; May 2017) with the following VIs (Virtual Instrument):
1. 'Peak detector' for finding center wavelength and y-value (counts). The following parameters are preferably used: width: 10, threshold: maximum value of input data divided by 5.
2. Dividing the counts (y-value) at the center wavelength value (see item 1) by 2 giving the y-value for the half-width of the peak. The two points having this half-width y-value were found and the difference between their two wavelength values were taken to give the FWHM parameter.

In a very preferred embodiment, the semiconducting nanosized material, preferably the QD preferably exhibit a peak maximum in the photoluminescence spectrum at a wavelength above 400 nm and a full width half maximum (FWHM) in the range of 10 nm to 80 nm, preferably in the range of 25 nm to 70, more preferably in the range of 30 nm to 60 nm, even more preferably in the range of 40 nm to 55 nm measured at 25° C. using a toluene solution.

Preferably, the semiconducting light emitting nanosized material, preferably quantum dots (QD) exhibit a peak maximum in the photoluminescence spectrum at a wavelength above 600 nm.

In a further embodiment of the present invention the semiconducting light emitting nanosized material preferably exhibits a peak maximum in the photoluminescence spectrum at a wavelength in the range of 610 nm to 670 nm.

Preferably, the peak maximum of the semiconducting nanosized material, preferably QD in the absorption spectrum is at a wavelength above 580 nm, more preferably above 590 nm. Preferably, the QD exhibit an Exciton peak maximum in the absorption spectrum at a wavelength in the range of 590 to 650 nm, more preferably in the range of 595 to 610 nm, in the absorption spectrum measured at 25° using a toluene solution.

Preferably, the semiconducting nanosized material, preferably the QD are based on indium phosphide (InP). Therefore, the present QD preferably comprise a measurable amount of InP. Preferably, the QD comprise a centre area of InP. More preferably, the centre area of the semiconducting nanosized material, preferably of InP comprises a size, e.g. a diameter in the range of 1.0 to 6.0 nm, preferably 2.5 nm to 5.5 nm, more preferably 3.5 to 4.5 nm. The size of the particles can be obtained by methods well known in the art. The particle size distribution is preferably assessed with Gatan Digital Micrograph software using images obtained from High Resolution Transmission Electron Microscopy (HRTEM) and provided as arithmetic mean (number average).

The sample preparation for performing the HRTEM can be performed by any conventional method. Preferably, the sample is purified before the measurement. E.g. 0.05 ml of the crude sample is dissolved with 0.2 ml toluene and precipitated with 0.2-0.4 ml ethanol using centrifuge. The solid is re-dissolved with 1-2 ml toluene. Few drops are deposited on Cu/C TEM grid. The grid is dried in vacuum at 80° C. for 1.5 h to remove the residues of the solvent as well as possible organic residues.

HRTEM and/or other TEM measurements are preferably carried out on a Tecnai F20 G2 machine equipped with EDAX Energy Dispersive X-Ray Spectrometer.

According to an embodiment of the present invention, said semiconducting light emitting nanoparticle preferably comprising a core and at least one shell layer, wherein the semiconducting light emitting nanoparticle preferably has the self-absorption value 0.6 or less, preferably it is in the range from 0.60 to 0.01, more preferably from 0.50 to 0.05, even more preferably from 0.45 to 0.12.

The Self-absorption value is calculated preferably according to the following procedure:

According to the present invention, the optical density (hereafter "OD") of the nanoparticles is preferably measured using Shimadzu UV-1800, double beam spectrophotometer, using toluene baseline, in the range between 350 and 750 nm.

The photoluminescence spectra (hereafter "PL") of the nanoparticles is preferably measured using Jasco FP fluorimeter, in the range between 460 and 850 nm, using 450 nm excitation.

The OD($\lambda$) and PL ($\lambda$) are the measured optical density and the photoluminescence at wavelength of $\lambda$.

$OD_1$ represented by the formula (I) is the optical density normalized to the optical density at 450 nm, and $\alpha_1$ represented by formula (II) is the absorption corresponding to the normalized optical density.

$$OD_1 = \frac{OD(\lambda)}{OD(\lambda = 450 \text{ nm})} \quad (I)$$

$$a_1 = 1 - 10^{-OD_1} \quad (II)$$

$$SA = \frac{\int_0^\infty PL_1(\lambda) a_1(\lambda) d\lambda}{\int_0^\infty PL_1(\lambda) d\lambda} \quad (III)$$

The self-absorption value of the nanoparticles represented by formula (III) is preferably calculated based on the OD and PL measurement raw data.

It is believed that lower-self absorbance of the nanoparticles is expected to prevent the QY decrease in high emitter concentrations.

Preferably, the semiconducting light emitting nanosized material exhibits a high thermal stability, preferably measured in air at a temperature of 150° C. for 1 hour in a polymeric film, more preferably, the difference of quantum yield of the semiconducting light emitting nanosized material before and after said heat treatment is at most 10%, preferably at most 5%. The thermal stability is determined by measuring the QY before and after heating by an appropriate measurement system (Hamamatsu Quantaurus). More information about the measurement is mentioned in the Examples.

Preferably, the semiconducting light emitting nanosized material exhibits a high thermal stability, preferably measured in air at a temperature of 150° C. for 1 hour in a powder, more preferably, the difference of quantum yield of the semiconducting light emitting nanosized material before and after said heat treatment is at most 10%, preferably at most 5%. The thermal stability is measured by an appropriate measurement system (Hamamatsu Quantaurus). More information about the measurement is mentioned in the Examples.

In another aspect, the present invention further relates to a composition comprising or consisting of the semiconducting nanosized material, preferably the QD of the present invention, preferably semiconducting light emitting nanoparticle of the present invention and at least one additional material, preferably the additional material is selected from the group consisting of organic light emitting materials, inorganic light emitting materials, charge transporting materials, scattering particles, host materials, nanosized plasmonic particles, photo initiators, and matrix materials.

A further embodiment of the present invention is a formulation comprising or consisting of the semiconducting nanosized material, preferably the QD of the present invention, and at least one solvent. Preferred solvents are mentioned above and below. Preferably, the solvent is selected from one or more members of the group consisting of aromatic, halogenated and aliphatic hydrocarbon solvents, more preferably selected from one or more members of the group consisting of toluene, xylene, ethers, tetrahydrofuran, chloroform, dichloromethane, hexane and heptane, purified water, ester acetates, alcohols, sulfoxides, formamides, nitrides, ketones.

Preferably, the semiconducting nanosized material have properties of a semiconducting light emitting nanoparticle.

Optical Medium

In another aspect, the present invention further relates to an optical medium comprising the nanosized light emitting material, a composition according to the present invention or a combination of any of these. Preferably, the optical medium comprises an anode and a cathode, and at least one organic layer comprising at least one semiconducting light emitting nanosized material according to the present invention, or at least one composition according to the present invention or a combination of any of these, preferably said one organic layer is a light emission layer, more preferably the medium further comprises one or more layers selected from the group consisting of hole injection layers, hole transporting layers, electron blocking layers, hole blocking layers, electron blocking layers, and electron injection layers.

Preferably, the optical medium comprises at least one organic layer wherein said the organic layer comprises at least one semiconducting light emitting nanosized material according to the present invention, and a host material, preferably the host material is an organic host material.

In some embodiments of the present invention, the optical medium can be an optical sheet, for example, a color filter, color conversion film, remote phosphor tape, or another film or filter.

According to the present invention, the term "sheet" includes film and/or layer like structured mediums.

Optical Device

In another aspect, the invention further relates to an optical device comprising the optical medium.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Definition of Terms

The term "semiconductor" means a material which has electrical conductivity to a degree between that of a conductor (such as copper) and that of an insulator (such as glass) at room temperature.

The term "organic" means any material containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The term "material" means any compound and/or substance having the features additionally mentioned for specifying the expression material.

The term "cluster" means a material having a specific composition of the different components.

The expression "quantum dot" means a semiconducting nanosized material being useful for any application. That is a quantum dot is designed as a material which can be used for the preparation of an optical media and/or the optical devices.

The expression "semiconducting nanosized material" means a material having semiconducting properties and having a nanosize as mentioned above and below, preferably the semiconducting nanosized material comprises at least three components for forming a semiconductor, such as InZnP, InGaP, GaZnP, etc as mentioned above and below. Preferred semiconducting nanosized material can be used as quantum dots. However, the expressions "semiconducting nanosized material at least two components". "semiconducting nanosized material at least three components" etc. includes any pre-product for obtaining quantum dots.

Advantages

The quantum dots according to the invention and the optical media and/or the optical devices, obtainable therefrom are distinguished over the prior art by one or more of the following surprising advantages:

1. The optical media and/or the optical devices obtainable using the quantum dots according to the invention exhibit very high thermal stability and a very long lifetime compared with optical media and/or optical devices obtained using conventional quantum dots.
2. The quantum dots according to the invention can be processed using conventional methods, so that cost advantages can also be achieved thereby.
3. The quantum dots according to the invention are not subject to any particular restrictions, enabling the workability of the present invention to be employed comprehensively.

4. The quantum dots according to the invention provide a high color purity and a low FWHM.
5. The quantum dots according to the invention can be produced in a very rapid and easy manner using conventional methods, so that cost advantages can also be achieved thereby.
6. The quantum dots according to the invention are less toxic than conventional formulations and have a high environmental acceptability.
7. The quantum dots according to the invention show a high emission in the visual range of the electromagnetic radiation.
8. The quantum dots according to the invention show a high quantum yield.
9. The quantum dots according to the invention show a high absorption.
10. The quantum dots according to the invention show a low self-absorption.
11. The quantum dots according to the invention show a high optical density per mg.
12. The formation of InP quantum dots using InP MSCs as the precursor (which we term the "SSP Reaction"; SSP=single source precursor) results in the formation of InP QD populations with improved size distribution and better max/min ratios. When a shell of ZnSe is put onto these InP QDs very narrow FWHMs have been reached, 38 nm. However, the Quantum Yield (QY) of such shell materials is effected by the lattice mismatch between the InP and ZnS shell. One way to tune the lattice mismatch is to add Ga to the InZnP QD being obtainable by the reaction mentioned above.

Adding Zn Precursors to the SSP reaction and/or adding Zn to the InP MSCs and forming InZnP cores allows Zn to be introduced into the SSP reaction allows the formation of InZnP quantum dots. These quantum dots provide astonishing improvements to particles containing Ga allowing the lattice mismatch of the final InZnGaP QDs and/or InZnP/GaP QDs to be tuned to give higher QYs whilst maintaining smaller particle size distribution and lower FWHM.

The improvements achieved by using the InP MSCs as single source precursor or similar starting materials are maintained in the following steps. That is, the present QD have very narrow FWHMs.

13. The present invention allows better control over the reaction and flexibility of the nature of the cores. Especially, the band gap can be controlled by the degree of alloying of Ga in the shell and the thickness of the shell.
14. The addition of Ga should blue-shift the optical properties of the QD. Therefore, InZnGaP QDs with similar CWL to InZnP QDs will need to be larger. This could result in QDs that have a higher absorption at 450 nm or any other wavelength.
15. The present QD are more stable due to uniformity of surface and/or ligand coverage.
16. The present QD are cheaper based on the fact that less particles are required for desired effect.
17. The present method provides compositions having a very high concentration of semiconducting nanosized material comprising high optical density, preferably quantum dots (QD). The high concentrations provide cost advantages with regard to the processing and the handling of the QD. Furthermore, these high concentrations are achieved without specific steps conventionally used for increasing the concentration.
18. The present method enables the use of very high concentrated reaction compositions for obtaining the present semiconducting nanosized material comprising high optical density. Therefore, the present method provides additional cost advantages.
19. The present method provides compositions having a very low content of by-products and semiconducting nanosized materials having a very defined composition and structure based on the lowering of by-products and precursors during the manufacturing process.
20. The present QD of the present invention are very clean and comprise very low amounts of by-products and precursors which is a very useful feature especially with regard to LED applications and other uses having the need for high purity starting materials.

These above-mentioned advantages are not accompanied by an undue impairment of the other essential properties.

There is no prior art reporting the formation of InZnP QDs and/or InGaP QDs using the SSP reaction for preparing red quantum dots. There is prior art which describes the synthesis of InZnP quantum dots and further shelling of these particles. However, they do not use the MSCs as the InP source. In this invention, preferably specific MSCs are used and these are injected at high temperature together with InP MSCs to form InP cores having a big diameter and low FWHM. No prior art teaches a Ga treatment of InZnP cores made using the SSP reaction.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not to be regarded merely as part of the embodiments of the present invention. For these features, independent protection can be sought in addition or as an alternative to each invention presently claimed.

The teaching on technical action disclosed in the present invention can be abstracted and combined with other examples.

The invention is explained in greater detail below with reference to a working example, but without being restricted thereby.

WORKING EXAMPLES

OD/mg Measurement

"Optical Density per milligram" (OD/mg) is a practical measurement parameter that is used to characterize the absorbance properties of the inorganic content of the QD material synthesised. The evaluation of the absorbance properties at the wavelength of 450 nm is important since in most application it is the typical peak of the excitation light source. The detailed procedure for measuring this parameter is described below. In the disclosure the term "OD/mg" will be regarded as a material property although strictly speaking the term OD refers to an optical absorption of an ensemble of particles in a solution with a specific optical path length.

In Glovebox (GB) QDs were cleaned according to standard procedures of precipitation from solvent/anti-solvent mixture several times. The solvents were dried, and the dry material was dissolved in 0.2 ml toluene. 40 µL of this solution was put into a crucible and measured in TGA. The inorganic content of the solution was determined by TGA. Another 40 µL was diluted and measured by standard quartz cuvette with 1 cm optical path length. the absorption spectrum of this solution was measured by using a UV-VIS spectrophotometer. The OD/mg of the material was calculated by calculating the OD at 450 nm per 1 ml solution in the 1 cm optical path cuvette, while the mg/ml was derived using the inorganic content from the TGA measurement.

Powder Thermal Stability Testing:

A solution of 20 mg/ml of clean inorganic QDs in toluene is divided into 3: one was used as reference and two samples were dried, exposed to air and heated to 150° C. for 1 h. After cooling to RT 2500 of toluene were added to both samples and QY was measured. Results are presented in Table 1.

Thermal Test in Polymer Matrix:

Acrylate monomer solution: IBOA (isobornyl acrylate, Sigma Aldrich) (1 ml) was mixed with 1% wt. of photo-initiator; IRGACURE 819 (Sigma Aldrich) (10 mg), sonicated for 6 min to enable solution of photo-initiator in IBOA.

QDs-IBOA solution: 30.3 mg QDs from batch were mixed with 71 µL IBOA solution (30% wt. QDs in IBOA). QDs were highly soluble in IBOA solution.

Film processing: Under nitrogen atmosphere (inside the glovebox), 20 µL of QDs-IBOA solution were coated on polycarbonate substrate (1.5 cm×6 cm), using 24 µm bar coater. The film was afterward cured using 365 nm UV lamp for 10 minutes. After curing the film was hazy and not clear. QY was measured using HAMAMATSU (absolute quantum yield spectrometer C11347).

For the thermal test, film was placed between two glass slides inside an oven at 150 C, for 1 hour, under air. QY of the heated film was measured by HAMAMATSU. Results are presented in Table 1.

Working Example 1: Synthesizing InP Magic Size Clusters (MSC)

Preparation of $In(MA)_3$ from Indium Acetate and Myristic Acid (MA):

In this synthesis, 9.3 gr (31.8 mmole) of indium acetate (99.99%) and 26.5 gr (116 mmole) of myristic acid (99%) were weighed into a 500 mL, 24/40, four-neck round-bottom flask equipped with a reflux condenser, septa and a tap between the flask and the condenser. The apparatus was evacuated with stirring at 100° C. Total evacuation time at 100° C. was 7 hours to evaporate acetic acid under reduced pressure and to generate the $In(MA)_3$.

Afterward, the flask was filled with argon, and a 100 ml portion of dry toluene was added.

Synthesis of InP MSCs from $In(MA)_3$ Solution and $P(TMS)_3$:

Injection Solution Preparation:

In a nitrogen filled glovebox, 4.66 mL (4.0 gr) of $P(SiMe_3)_3$ was added to 48 mL of toluene in a vial with a septum.

Additions Solution Preparation:

3.5 ml $P(SiMe_3)_3$ were mixed with 16.0 ml toluene.

In Glovebox (GB), the flask was heated to 103° C. The $P(SiMe_3)_3$ injection solution was then injected (using 50 ml syringe). The formation of MSCs was monitored via UV-vis of timed aliquots taken from the reaction solution.

The additions solution was added at the following times and amounts:

4 ml $P(TMS)_3$ solution was added after 12 min
4 ml $P(TMS)_3$ solution was added after 24 min
4 ml $P(TMS)_3$ solution was added after 36 min After 42 min the solution was cooled, sample was stored in GB.

Purification of InP MSCs:

Clusters were cleaned ×5 times:

1. In GB clusters solution was transferred into 750 ml centrifuge tube (equipped with Teflon film). The crude MSCs was precipitated using centrifuge: 2700G, 7 min.
2. The supernatant (containing clusters) was transferred to another tube, to which 100 ml of toluene was added.
3. In GB, the supernatant (containing toluene) were precipitated with 150 ml acetonitrile in GB. centrifuge: 2700G, 7 min.
4. After centrifuge the supernatant was decanted and 50 ml of toluene were added to the precipitant in the tube.
5. The liquid was transferred into three 50 ml tubes (equipped with Teflon film), and 11 ml of acetonitrile were added to each tube. The solution became turbid.
6. After centrifuge the supernatant was decanted, and then 13 ml of toluene was added to the precipitant in each 50 ml tube. It dissolved to give a clear yellow solution.
7. 8 ml acetonitrile was added. Solution became turbid immediately (like freezing) with large orange flakes. It was then put into centrifuge for 5 min at 5000 rpm.
8. After decanting the supernatant, 5 ml of toluene was added to each tube. After centrifuge the supernatant was transferred to two 20 ml vials.
9. 4 ml acetonitrile was added to each vial. After centrifuge the precipitant was dissolved in 30 ml squalene.

Working Example 2: Synthesizing InZnP SSP Red Cores with $Zn(OIAc)_2$

Preparation of InP Magic Size Clusters (MSC)

InP MSC are prepared by the method mentioned above. However, the InP MSC are dissolved in squalene. The inorganic content of the solution was determined by TGA (Thermal gravimetry analysis): 148.75 mg/ml.

Preparation of $Zn(OIAc)_2$ in Squalene

In 100 ml flask, 1.1206 g of $Zn(OIAc)_2$ was weighted with 3.85 ml of oleic acid (OIAc) and with 12 ml squalane. The flask was mounted on Schlenk line and was pumped at RT for few minutes, then the flask was heated to 120° C. for 1 h under vacuum to remove acetic acid. The flask was cooled to RT and stored in GB for further use.

Preparation of Injection Solution:

0.444 ml of InP MSCs solution in squalane (containing 66.0 mg of inorganics) were mixed with 1.426 ml of degassed squalane in GB.

Preparation of Additions Solutions:

Additions 1: In GB, 0.466 ml InP MSCs solution (69.29 mg of inorganics) is mixed in 5.534 ml degassed squalane Additions 2: The solution of Zn(OIAc)$_2$ is heated to 80° C. before injection Formation of InZnP QDs In GB 6.3 ml of squalane were put into 100 ml 4-neck flask with magnetic stirrer and degassed for 2 h at 120° C. The flask was mounted on a Schlenk line and heated to 375° C. under argon.

1.5 ml of the injection solution are then injected into the flask. After 40 s, 0.5 ml of the additions solution is added during 5 sec. After 10 s another portion of 0.5 ml is added in the same way. After 11 additions are made (Addition 1), 16 additions of Zn(OIAc)$_2$/squalane are injected into the flask (Addition 2), 0.5 ml each addition, 5 sec each addition, 20 sec interval time between each addition.

The reaction kept heating for additional 1 min. The flask was cooled to RT and stored in GB. CWL$_{exciton}$=596 nm, CWL$_{PL}$=624 nm, % QY=16, FWHM=43 nm

Working Example 3: Synthesizing THICK ZnS Shell

Preparation of Ga(OIAc)$_3$ in ODE (1-octadecene)

In GB, 1.774 g GaCl$_3$ were weighted into a 250 ml round bottom flask with 12.74 ml OIAc and 80 ml ODE. The solution became orange immediately after addition of the OIAc. The flask was mounted on a Schlenk line and was vacuumed at 50° C. for few minutes and then the flask was heated to 140° C. for ~1 h under Ar. The color of the solution became darker, brown-orange. The flask was cooled to RT and stored in GB.

GaP Shell:

In GB, 7.5 ml crude InZnP cores were transferred into 100 ml round bottom flask with 0.69 ml Ga(OIAc)$_3$ in ODE. The flask was mounted on Schlenk line and pumped for few min at 50° C. Then the mixture was heated to 200° C. under Ar for 1 h and 250° C. for additional 1 h.

Growth of ZnS Shell:

At 250° C. 0.12 ml of TOP-S 1M were injected and the flask was heated to 300° C. The reaction was kept at 300° C. for 1 h and cooled to RT. Cleaning for OD/mg measurements:

In GB, 1 ml of crude was diluted with 2 ml toluene. The clear solution was precipitated by adding 3 ml of EtOH (centrifuge: 5000 rpm, 5 min). The solid was re-dispersed with 1 ml toluene and precipitated again with 2 ml EtOH (centrifuge: 5000 rpm, 10 min). The solid was vacuumed for a few minutes and re-dissolved with 150 μl toluene.

Cleaning for OD/mg Measurements:

In GB, 1 ml crude was diluted with 1 ml toluene. The solution was precipitated by adding 3 ml ethanol. Centrifuge: 5 min, 5000 rpm. The solid was re-dispersed with 1 ml toluene and precipitated again by adding 2 ml ethanol. Centrifuge: 5 min, 5000 rpm. The solid was dried and re-dissolved with 150 μL toluene. Results are presented in Table 1.

Crystal Binding with Methoxy Polyethylene Glycol Thiol (m-PEG Thiol):

2 ml crude were transferred into 50 ml flask. 0.4 g of m-PEG thiol (Mn=800) were dissolved with 3 ml of PGMEA in 7 ml vial and were transferred into the flask containing the crude. The mixture was pumped at RT for few minutes and heated to 150° C. (reflux) for 2 h under Ar.

Working Example 4: Synthesizing THIN ZnS Shell

The same as Working example 3, but injecting of only 0.06 ml TOP-S instead of 0.12 ml. OD/mg (inorganics)=2.5.

Working Example 5: Synthesizing THIN ZnS Shell

The same as Working example 3, but injecting of 0.35 ml TOP-S 0.2M (instead of 0.12 ml 1M).

Crystal Binding with Zn(OAc)$_2$/m-PEG thiol:

2 ml crude were transferred into 50 ml flask with 0.33 g Zn(OAc)$_2$. 0.4 g of m-PEG thiol (Mn=800) were dissolved with 3 ml of PGMEA in 7 ml vial and were transferred into the flask containing the crude. The mixture was pumped at RT for few minutes and heated to 150° C. (reflux) for 2 h under Ar.

Results are presented in Table 2.

Working Example 6: Synthesizing Red Core-Shell NPs with Zn(IST)$_2$

Preparation of Zn(IST)$_2$ in Squalene

In 100 ml flask, 1.1208 g of Zn(IST)$_2$ was weighted with 3.9 ml of iso-stearic acid with 12 ml squalane. The flask was mounted on Schlenk line and was pumped at RT for few minutes, then the flask was heated to 120° C. for 1 h under vacuum. The flask was cooled to RT and stored in GB for further use. The preparation of cores was as in Working example 2: CWL$_{exciton}$=598 nm, CWL$_{PL}$=627 nm, % QY=15, FWHM=45 nm. The synthesis is the same as in Working example 2. OD/mg (inorganics)=2.2

Working Example 7: Synthesizing Red Core-Shell with Zn(ST)$_2$

The preparation of cores was as in Working example 3 using Zn(ST)$_2$ as the Zn precursor: CWL$_{exciton}$=592 nm, CWL$_{PL}$=622 nm, % QY=60, FWHM=46 nm. The preparation of shells was as in Working example 2. Results are presented in Table 1.

Working Example 8: Synthesizing Red Core-Shell with Zn(ST)$_2$

Preparation of Zn(St)$_2$ Solution in Squalane 14.7 g of Zn(St)$_2$ was weighed into 100 ml flask together with 45.7 ml of squalane. Under argon the flask was heated to 130° C. and left at this temp under vacuum for 2 h. Then the flask was cooled to 100° C. under argon. 7.9 ml of pre-pumped squalane were put in GB into 100 ml flask. The flask was pumped during the heating to 130° C. and was heated to 375° C. under Ar.

Preparation of the Injection Solution:

0.56 ml of the solution of MSCs (containing 83.27 mg of inorganics) were mixed in GB with 1.78 ml squalane.

Preparation of the Additions Solution:

0.56 ml of the solution of MSCs were mixed in GB with 6.63 ml squalane.

Preparation of the DDT/ODE Solution for the CB Process:

3.1 ml of pre-bubbled (with Ar) DDT were mixed with 23 ml of pre-pumped ODE.

At 375° C., 1.9 ml of the injection solution was injected. After 40 seconds, 0.6 ml of additional solution was injected (during ~5 sec) and after ~10 sec another 0.6 ml were injected, and in this way 10 additions of 0.6 ml were performed. Then 0.6 ml of the Zn(St)$_2$ solution was injected (during ~5 sec) and after ~20 sec another 0.6 ml were injected and so on; after 5Zn additions Ga(OIAc)$_3$ solution of 0.126M was added alternately to the Zn(st)$_2$ solution, each time 0.2 ml in volume was injected during ~3 sec, interval time ~10 sec. After 16 additions of Zn and 12 of Ga, the temperature was set to 300° C. and the solution was let to react for 3 more minutes. Then 0.35 ml of TOP-S 1M were slowly injected. After 60 min the flask was cooled to 150° C. and 25 ml of the DDT/ODE solution was injected. After 60 min the flask was cooled to RT. Results are presented in Table 1.

TABLE 1

Results of Quantum dots (powder thermal test at 150° C. in air)

|  | Exp. 3 | Exp. 5 | Exp. 6 | Exp. 7 |
|---|---|---|---|---|
| % QY before CB | 67 | 70 | 66 | 60 |
| FWHM (nm) | 45 | 56 | 45 | 50 |
| OD/mg (inorganics) | 2.2 | 2.0 | 2.2 | 1.7-1.8 |
| % organics | 54 |  | 52 | 70-80% |
| % QY after CB & cleaning | 62 | 64 | 62 | 55 |
| % QY after CB & thermal test | 60 | 59 | 57 | 45 |

TABLE 2 thermal test in polymer matrix

|  | Exp. 5 | Exp. 8 |
|---|---|---|
| % QY in toluene | 68 | 64 |
| % QY in film after curing | 59 | 53 |
| % QY after heating & 1 day aging | 58 | 28 |

The invention claimed is:

1. A method d for synthesizing a semiconducting nanosized material comprising at least two components, wherein the method comprises the steps of
   a) providing a III-V semiconducting nanosized material;
   b) heating the provided III-V semiconducting nanosized material to a temperature at least 250° C.;
   c) adding a III-V semiconducting nanosized material in at least one additional step to the heated III-V semiconducting nanosized material of step b);
   d) reacting the added III-V semiconducting nanosized material with the heated III-V semiconducting nanosized material of step b) in order to achieve a semiconducting nanosized material comprising at least two components;
   wherein the III-V semiconducting nanosized material provided in step a) is essentially identical to the III-V semiconducting nanosized material added in step c).

2. The method according to claim 1, wherein said III-V semiconducting nanosized material provided in step a) is identical to the III-V semiconducting nanosized material added in step c).

3. The method according to claim 1, wherein said III-V semiconducting nanosized material in step a) and/or c) is selected from the group consisting of InP, InAs, InSb, GaP, GaAs, GaSb and mixtures thereof.

4. The method according to claim 1, wherein the III-V semiconducting nanosized material in step a) and/or c) is a cluster material.

5. The method according to claim 1, wherein steps c) and d) are performed multiple time.

6. The method according to claim 1, further comprising steps e) and f)
   e) providing a second precursor;
   f) reacting the nanosized material obtained by step d) with the second precursor in order to achieve a semiconducting nanosized material comprising at least three components.

7. The method according to claim 6, wherein the second precursor is a Zn, or a Cd source.

8. The method according to claim 6, wherein a composition comprising the second precursor is injected to the III-V semiconducting nanosized material.

9. The method according to claim 6, further comprising steps g) and h)
   g) providing a third cation precursor;
   h) reacting the semiconducting nanosized material comprising at least three components with the third cation precursor.

10. The method according to claim 9, wherein the third cation precursor is a Ga source.

11. The method according to claim 9, wherein a shell of a semiconductor is grown onto the semiconducting nanosized material comprising at least two components being obtained by a method comprising steps a) to d), the semiconducting nanosized material comprising at least three components being obtainable by a method comprising steps a) to f), or the semiconducting nanosized material comprising at least three components being obtainable by a method comprising steps a) to h.

12. The method according to claim 1, wherein the III-V semiconducting nanosized material provided in step a) and the III-V semiconducting nanosized material added in step c) contain at most a low amount of Zn precursor.

13. The method according to claim 9, wherein the nanosized material comprising at least three components and the third cation precursor are mixed at a temperature below 150° C. and heated after the mixing.

14. The method according to claim 13, wherein the mixture of the nanosized material comprising at least three components and the third cation precursor are heated to a temperature in the range of 100° C. to 350° C.

15. The method according to claim 1, wherein said III-V semiconducting nanosized material in step a) and/or c) is InP.

16. The method according to claim 1, wherein the III-V semiconducting nanosized material is a III-V magic sized cluster (MSC) selected from the group consisting of InP, InAs, InSb, GaP, GaAs and GaSb magic sized cluster.

17. The method according to claim 1, wherein the III-V semiconducting nanosized material is a InP magic sized cluster (InP MSC).

18. The method according to claim 1, wherein the III-V semiconducting nanosized material is $In_{37}P_{20}(O_2CR^1)_{51}$, wherein $O_2CR^1$ is —$O_2CCH_2$Phenyl, or a substituted or unsubstituted fatty acid.

19. The method according to claim 1, wherein the III-V semiconducting nanosized material is $In_{37}P_{20}(O_2CR^1)_{51}$, wherein $O_2CR^1$ is —$O_2CCH_2$Phenyl, or a substituted or unsubstituted fatty acid selected from the group consisting of hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate, myristate, laurate, palmitate, stearate, iso-stearate and oleate.

20. A semiconducting nanosized material comprising at least three components obtained by the method according to claim 6.

21. The composition comprising semiconducting nanosized material comprising at least three components according to claim 20, which further comprises at least one additional material.

22. A formulation comprising the semiconducting nanosized material comprising at least three components according to claim 20, and at least one solvent.

23. An electronic device, optical device or a biomedical device, comprising the semiconducting nanosized material comprising at least three components according to claim 20.

24. An optical medium comprising the semiconducting nanosized material comprising at least three components according to claim 20.

25. An optical device comprising the optical medium according to claim 24.

26. A method for synthesizing a semiconducting nanosized material comprising at least two components, wherein the method comprises the steps of
  a) providing a III-V semiconducting nanosized material;
  b) heating the provided III-V semiconducting nanosized material to a temperature at least 250° C.;
  c) adding a III-V semiconducting nanosized material in at least one additional step to the heated III-V semiconducting nanosized material of step b);
  d) reacting the added III-V semiconducting nanosized material with the heated III-V semiconducting nanosized material of step b) in order to achieve a semiconducting nanosized material comprising at least two components;

wherein steps c) and d) are performed multiple times.

27. A method for synthesizing a semiconducting nanosized material comprising at least two components, wherein the method comprises the steps of
  a) providing a III-V semiconducting nanosized material;
  b) heating the provided III-V semiconducting nanosized material to a temperature at least 250° C.;
  c) adding a III-V semiconducting nanosized material in at least one additional step to the heated III-V semiconducting nanosized material of step b);
  d) reacting the added III-V semiconducting nanosized material with the heated III-V semiconducting nanosized material of step b) in order to achieve a semiconducting nanosized material comprising at least two components;
  e) providing a second precursor;
  f) reacting the nanosized material obtained by step d) with the second precursor in order to achieve a semiconducting nanosized material comprising at least three components.

* * * * *